United States Patent
Lyon

(10) Patent No.: US 6,556,949 B1
(45) Date of Patent: Apr. 29, 2003

(54) SEMICONDUCTOR PROCESSING TECHNIQUES

(75) Inventor: Richard C. Lyon, Boulder Creek, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/314,275

(22) Filed: May 18, 1999

(51) Int. Cl.⁷ .................................................. G03F 7/20
(52) U.S. Cl. ......................... 702/182; 702/33; 702/79; 702/118; 702/120; 702/176; 702/183
(58) Field of Search .............................. 702/33–36, 40, 702/79, 81–84, 117, 118, 119, 120–123, 140, 172, 176–178, 179, 181, 182–185, FOR 103, FOR 104, FOR 123–125, FOR 131–134, FOR 135, FOR 136, FOR 137, FOR 139, FOR 170, FOR 171; 700/121; 438/14, 15, 16; 345/133, 134, 140, 113

(56) References Cited

U.S. PATENT DOCUMENTS

| | | | | |
|---|---|---|---|---|
| 4,356,961 A | * | 11/1982 | Smith ....................... | 235/1 EA |
| 4,703,434 A | * | 10/1987 | Brunner ..................... | 356/509 |
| 4,890,239 A | * | 12/1989 | Ausschnitt et al. ......... | 364/491 |
| 5,108,570 A | | 4/1992 | Wang ...................... | 204/192.3 |
| 5,124,927 A | * | 6/1992 | Hopewell et al. ......... | 250/491.1 |

(List continued on next page.)

FOREIGN PATENT DOCUMENTS

| | | | | |
|---|---|---|---|---|
| EP | 0877308 A | 11/1998 | ......... | G05B/19/418 |
| JP | 1-283934 | 11/1989 | | |
| JP | 8-149583 | 6/1996 | ............ | H04Q/9/00 |
| JP | 9-34535 | 2/1997 | ........... | G05B/23/02 |
| JP | 11-67853 | 3/1999 | | |

OTHER PUBLICATIONS

Prasad Rampalli et al., "CEPT–A Computer–Aided Manufacturing Application for Managing Equipment Reliability and Availability in the Semi–Conductor Industry", IEE Transactions on Components, Hybrids, and Manufacturing Technology, IEEE Inc. New York, vol. 14, No. 3, pp. 499–506, (1991).

W.R. Runyan et al. *Semiconductor Integrated Circuit Processing Technology*, Addison—Wesley Publ. Comp. Inc., p. 48, 1994.

Peter van Zandt, Microchip Fabrication, 3rd ed., McGraw–Hill, pp. 472–478, 1997.

(List continued on next page.)

*Primary Examiner*—Marc S. Hoff
*Assistant Examiner*—Carol S W Tsai
(74) *Attorney, Agent, or Firm*—Albert J. Dalhuisen

(57) ABSTRACT

The present invention provides a manufacturing environment (210) for a wafer fab, and an SPDA data environment (212) for acquiring processing parameters and metrology data of production runs. A computation environment (214) processes the SPDA data to prepare delta graphs (536, 540 and 542) of the present invention. These delta graphs are then analyzed in an analysis environment (216). An MES environment (218) evaluates the analysis and executes a process intervention if the results of the analysis indicate processing or product quality problems in the process run of the manufacturing environment (210). Additionally, the invention provides for SPDA delta graphs of SPC control charts as well as SPC techniques utilizing process control limits based on delta graphs to identify, analyze and troubleshoot semiconductor processing problems, in order to improve equipment reliability and wafer yield. The present invention also provides a process (700) for computer integrated equipment time states including a service procedures module (755) linked to preventive maintenance time states (735 and 742) and to a repair time state (731).

22 Claims, 16 Drawing Sheets

U.S. PATENT DOCUMENTS

| | | | | |
|---|---|---|---|---|
| 5,227,838 A | * | 7/1993 | Nakanishi et al. | 355/43 |
| 5,236,868 A | | 8/1993 | Nulman | 437/190 |
| 5,260,868 A | | 11/1993 | Gupta et al. | 364/402 |
| 5,293,216 A | * | 3/1994 | Moslehi | 219/121.6 |
| 5,295,242 A | | 3/1994 | Mashruwala et al. | 395/159 |
| 5,367,624 A | | 11/1994 | Cooper | 395/157 |
| 5,398,336 A | | 3/1995 | Tantry et al. | 395/600 |
| 5,408,405 A | | 4/1995 | Mozumder et al. | 364/151 |
| 5,410,473 A | | 4/1995 | Kaneko et al. | 364/413.06 |
| 5,586,041 A | | 12/1996 | Mangrulkar | 364/474.16 |
| 5,629,216 A | | 5/1997 | Wijaranakula et al. | 438/502 |
| 5,698,989 A | | 12/1997 | Nulman | 324/719 |
| 5,715,181 A | * | 2/1998 | Horst | 364/554 |
| 5,719,495 A | | 2/1998 | Moslehi | 324/158.1 |
| 5,740,429 A | | 4/1998 | Wang et al. | 395/615 |
| 5,754,297 A | | 5/1998 | Nulman | 356/381 |
| 5,761,064 A | | 6/1998 | La et al. | 364/468.17 |
| 5,783,342 A | * | 7/1998 | Yamashita et al. | 356/511 |
| 5,808,303 A | | 9/1998 | Schlagheck et al. | 250/330 |
| 5,862,054 A | | 1/1999 | Li | 364/468.28 |
| 5,864,483 A | | 1/1999 | Brichta | 364/468.16 |
| 5,883,437 A | | 3/1999 | Maruyama et al. | 257/773 |
| 5,905,032 A | * | 5/1999 | Walton et al. | 435/173.2 |
| 5,910,011 A | | 6/1999 | Cruse | 438/16 |
| 5,914,879 A | * | 6/1999 | Wang et al. | 700/111 |
| 5,956,251 A | | 9/1999 | Atkinson et al. | 364/468.16 |
| 5,987,398 A | * | 11/1999 | Halverson et al. | 700/275 |
| 6,054,379 A | | 4/2000 | Yau et al. | 438/623 |
| 6,076,028 A | * | 6/2000 | Donnelly et al. | 701/45 |
| 6,085,747 A | * | 7/2000 | Axe et al. | 128/204.23 |
| 6,128,588 A | * | 10/2000 | Chacon | 703/6 |
| 6,138,143 A | | 10/2000 | Gigliotti et al. | 709/203 |
| 6,201,999 B1 | | 3/2001 | Jevtic | 700/100 |
| 6,204,220 B1 | * | 3/2001 | Jordan et al. | 504/142 |
| 6,223,091 B1 | | 4/2001 | Powell | 700/80 |
| 6,226,563 B1 | | 5/2001 | Lim | 700/121 |
| 6,249,712 B1 | | 6/2001 | Boiquaye | 700/31 |
| 6,336,055 B1 | * | 1/2002 | Cho | 700/109 |

OTHER PUBLICATIONS

R. Zorich, Handbook Of Quality Integrated Circuit Manufacturing, Academic Press Inc., pp. 464–498, 1991.

SEMI E10–96, Standard For Definition And Measurement Of Equipment Reliability, Availability And Maintainability (RAM), published by Semiconductor Equipment and Materials International (SEMI), pp. 1–23, 1996.

SEMI Draft Doc. 2817, *New Standard: Provisional Specification for CIM Framework Domain Architecture*, published by Semiconductor Equipment and Materials International (SEMI), pp. 1–53, 1998.

* cited by examiner

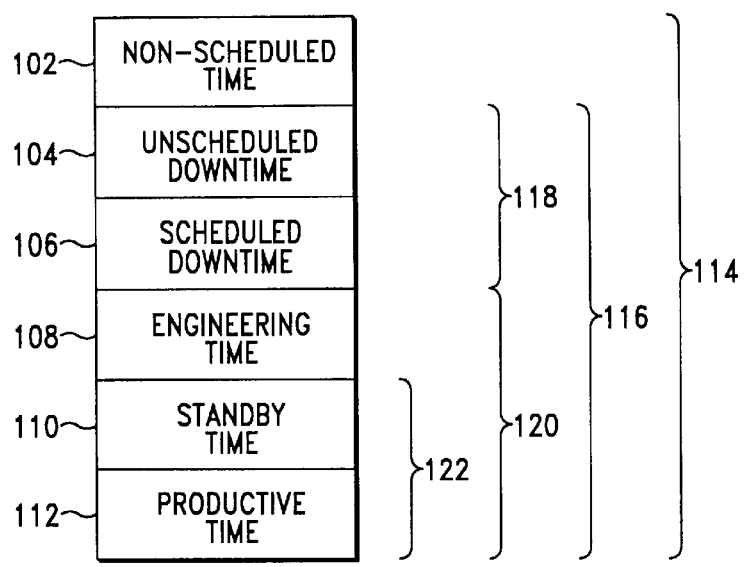
FIG.—3
(PRIOR ART)
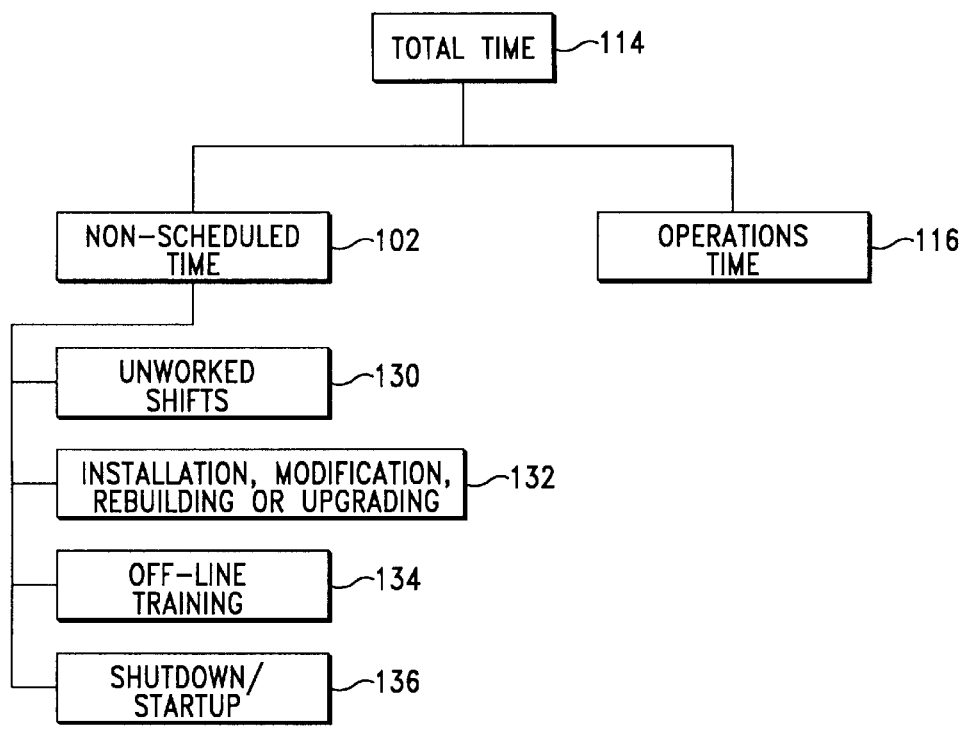
FIG.—4
(PRIOR ART)

SEMICONDUCTOR PROCESSING TECHNIQUES

FIELD OF THE INVENTION

The present invention relates to techniques for semiconductor processing.

BACKGROUND OF THE INVENTION

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Integrated circuits are typically fabricated from semiconductor wafers in a process consisting of a sequence of processing steps. This process, usually referred to as wafer fabrication or wafer fab, includes such operations as oxidation, etch mask preparation, etching, material deposition, planarization and cleaning.

A summary of an aluminum gate PMOS (p-channel metal oxide semiconductor transistor) wafer fab process 40 is schematically shown in FIG. 1, illustrating major processing steps 41 through 73, as described in W. R. Runyan et al., *Semiconductor Integrated Circuit Processing Technology*, Addison-Wesley Publ. Comp. Inc., p.48, 1994. Each of these major processing steps typically include several sub steps. For example, a major processing step such as metallization to provide an aluminum layer by means of sputter deposition in a wafer fab chamber is disclosed in U.S. Pat. No. 5,108,570 (R. C. Wang, 1992). This sputter deposition process is schematically shown in sub steps 81 through 97 of process 80, see FIG. 2.

FIGS. 1 and 2 show sequential wafer fab processes. It is also known to utilize wafer fab sub systems which provide parallel processing steps. Such sub systems typically include one or more cluster tools. A cluster tool as defined herein includes a system of chambers and wafer handling equipment wherein wafers are processed in the cluster tool chambers without leaving a controlled cluster tool environment such as vacuum. An example of a cluster tool is disclosed in U.S. Pat. No. 5,236,868 (J. Nulman, 1993) which employs a vacuum apparatus having a central chamber and four processing chambers. A wafer handling robot in the central chamber has access to the interior of each the processing chambers in order to transfer wafers from the central chamber into each of the chambers while keeping the wafers in a vacuum environment. In one example, wafers in the '868 cluster are first transferred for processing to a cleaning chamber, then to a PVD (physical vapor deposition) chamber, followed by transfer to an annealing chamber and subsequently to a degassing chamber, thus utilizing a sequential process. It is also known to use cluster tools such as those disclosed in the '868 patent to process wafers in chambers which are used in parallel. For example, if a slow processing step is followed by a fast processing step, three chambers can be used in parallel for the slow process while the fourth chamber is used for the fast process.

It is well known to those of ordinary skill in the art that one or more processing parameters of a typical wafer fab process step need to be controlled within a relatively narrow range in order to obtain a product which has the desired characteristics. For example, U.S. Pat. No. 5,754,297 (J. Nulman, 1998) discloses a method and apparatus for monitoring a deposition rate during wafer fab metal film deposition such as sputtering. The '297 patent teaches that the metal deposition rate decreases with increasing age of the sputter target if the input sputter power level is maintained at a constant level. As a consequence, critical processing characteristics, such as the metal deposition rate, may vary from run to run for a given wafer fab processing chamber in ways that can affect the yield and quality of devices processed in that chamber. As disclosed in the '297 patent, the deposition system can be more readily maintained near desired levels when processing variables, such as the power input to the sputtering source, are adjusted in response to observed variations in the metal deposition processing characteristics. This requires in-situ measurement of processing characteristics, using for example a deposition rate monitor based on the optical attenuation of light passing through the deposition environment, thereby detecting the rate at which material is flowing from the deposition source to the deposition substrate, as described more fully in the '297 patent.

Advances in semiconductor materials, processing and test techniques have resulted in reducing the overall size of the IC circuit elements, while increasing their number on a single body. This requires a high degree of product and process control for each processing step and for combinations or sequences of processing steps. It is thus necessary to control impurities and particulate contamination in the processing materials such as process gases. Also, it is necessary to control processing parameters such as temperature, pressure, gas flow rates, processing time intervals and input sputter power, as illustrated in the '570 and '297 patents. As illustrated in FIGS. 1 and 2, a wafer fab includes a complex sequence of processing steps wherein the result of any particular processing step typically is highly dependent on one or more preceding processing steps. For example, if there is an error in the overlay or alignment of etch masks for interconnects in adjacent IC layers, the resulting interconnects are not in their proper design location. This can result in interconnects which are packed too closely, forming electrical short defects between these interconnects. It is also well known that two different processing problems can have a cumulative effect. For example, a misalignment of interconnect etch masks which is not extensive enough to result in an electrical short, can still contribute to causing an electrical short if the process is slightly out of specification for allowing (or not detecting) particulate contamination having a particle size which would not have caused an electrical short if the interconnect masks had been in good alignment.

Processing and/or materials defects such as described above generally cause a reduced wafer fab yield, wherein the yield is defined as the percentage of acceptable wafers that are produced in a particular fab. In-process tests and monitoring of processing parameters are utilized to determine whether a given in-process product or process problem or defect indicates that intervention in the process run is necessary, such as making a processing adjustment or aborting the run. Consequently, product and process control techniques are used extensively throughout a wafer fab. When possible, yield problems are traced back to specific product or processing problems or defects to ultimately improve the yield of the wafer fab. High yields are desirable for minimizing manufacturing costs for each processed wafer and to maximize the utilization of resources such as electrical power, chemicals and water, while minimizing scrap re-work or disposal.

It is known to use SPC (statistical process control) and SQC (statistical quality control) methods to determine suitable wafer fab control limits and to maintain the process within these limits, see for example R. Zorich, *Handbook Of Quality Integrated Circuit Manufacturing,* Academic Press Inc., pp. 464–498, 1991. SPC and SQC methodologies suitable for a wafer fab include the use of control charts, see for example R. Zorich at pp. 475–498. As is well known to those of ordinary skill in the art, a control chart is a graphical display of one or more selected process or product variables, such as chamber pressure, which are sampled over time. The target value of a particular variable and its upper and lower control limits are designated on the chart, using well known statistical sampling and computation methods. The process is deemed out of control when the observed value of the variable, or a statistically derived value such as the average of several observed values, is outside the previously determined control limits. Control limits are typically set at a multiple of the standard deviation of the mean of the target value, such as for example $2\sigma$ or $3\sigma$. The target value is derived from a test run or a production run which meets such wafer fab design criteria as yield, process control and product quality. SPC and SQC are considered synonymous when used in the above context, see R. Zorich at p. 464.

Effective wafer inventory management is necessary for maintaining inventories of unprocessed or partly processed wafers at a minimum and thereby minimizing the unit cost of the semiconductor devices which are produced in the wafer fab. Minimizing inventories of wafers in process also has a wafer yield benefit because it is well known that the longer wafers are in the process, the lower their yield. Wafer inventory management typically uses scheduling techniques to maximize equipment capabilities in view of the demand for processed wafers, for example by scheduling parallel and series processing steps to avoid processing bottlenecks. Effective inventory management of a wafer fab also requires a low incidence of bottlenecks or interruptions due to unscheduled down times which can for example be caused by unscheduled maintenance, interruptions resulting from processing parameters which are outside their specified limits, unavailability of required materials such as a process gas, unavailability of necessary maintenance replacement parts, unavailability of a processing tool such as a chamber, or electrical power interruptions.

Many components or sub-systems of a wafer fab are automated in order to achieve a high degree of processing reliability and reproducibility and to maximize yields. Wafer fab tools such as chambers are typically controlled by a computer using a set of instructions which are generally known as a recipe for operating the process which is executed by the tool. However, it is recognized that a high degree of automation wherein various processes and metrologies are integrated, is difficult to achieve due to the complexity and inter dependency of many of the wafer fab processes, see for example Peter van Zandt, *Microchip Fabrication,* $3^{rd}$ ed., McGraw-Hill, pp. 472–478, 1997.

It is well known to those of ordinary skill in the art that the functions of semiconductor manufacturing equipment, including for example a wafer fab, can be defined in basic equipment states such as the six states schematically illustrated in FIG. 3, see *SEMI E10-96, Standard For Definition And Measurement Of Equipment Reliability Availability, And Maintainability (RAM),* published by Semiconductor Equipment and Materials International (SEMI), pp. 1–23, 1996. The semiconductor industry typically uses these six equipment states to measure and express equipment RAM (reliability availability and maintainability), based on functional equipment issues which are independent of who performs the function. These six basic equipment states include non-scheduled time 102 (FIG. 3), unscheduled downtime 104, scheduled downtime 106, engineering time 108, standby time 110 and productive time 112. Non-scheduled time 102 represents the time period wherein the equipment is not scheduled to be used, for example unworked shift. Unscheduled downtime 104 concerns time periods wherein the equipment is not in a condition to perform its intended function, e.g. during equipment repair. Scheduled downtime 106 occurs when the equipment is capable of performing its function but is not available to do this, such as process setup or preventive maintenance. Engineering time 108 concerns the time period wherein the equipment is operated to conduct engineering tests, for example equipment evaluation. Standby time 110 is a time period wherein the equipment is not operated even though it is in a condition to perform its intended function and is capable of performing its function, for example no operator is available or there is no input from the relevant information systems. Productive state 112 represents the time period wherein the equipment is performing its intended function, such as regular production and rework.

Total time period 114, see FIG. 3, is the total time during the period being measured; this includes the six equipment states 102, 104, 106, 108, 110 and 112. Operations time 116 concerns the total time period of states 104, 106, 108, 110 and 112. Operations time 116 includes equipment downtime 118 consisting of states 104 and 106, and equipment uptime 120. Equipment uptime 120 includes engineering time 108 and manufacturing time 122 which consists of standby time 110 and productive time 112.

FIGS. 4 and 5 provide more detailed schematic illustrations of the six equipment states shown in FIG. 3, see SEMI E10-96, at pp. 1–6. As depicted in FIG. 4, total time 114 consists of non-scheduled time 102 and operations time 116. Non-scheduled time 102 includes unworked shifts 130, equipment installation, modification, rebuilding or upgrading 132, off-line training 134 and shutdown or start-up time period 136. Operations time 116, as schematically illustrated in FIG. 5, consists of equipment downtime 118 and equipment uptime 120. Equipment downtime 118 consists of unscheduled downtime 104 and scheduled downtime 106. Unscheduled downtime 104 includes downtime for maintenance delay 140, repair time 142, changing consumables/ chemicals 144, out of specification input 146 or facilities related downtime 148. Scheduled downtime 106 concerns downtime for maintenance delay 150, production test 152, preventive maintenance 154, changing consumables/ chemicals 156, setup 158 or facilities related 159.

Equipment uptime 120, depicted in FIG. 5, consists of engineering time 108 and manufacturing time 122. Engineering time 108 includes process experiments 160 and equipment experiments 162. Manufacturing time 110 consists of standby time 110 and productive time 112. Standby time 110 includes time during which there is no operator 180, no product 182, no support tool 184 or when an associated cluster module is down 186. Productive time 112 concerns a time period during which there is regular production 190, work for a third party 192, rework 194 or an engineering run 196. The various equipment states as described in connection with FIGS. 3–5 provide a basis for communicating and evaluating RAM related equipment information in the semiconductor industry. RAM related equipment information includes topics which are well known to those of ordinary skill in the art such as: equipment reliability, equipment availability, equipment maintainability and equipment utilization, see for example SEMI E10-96 at pp. 6–11.

Accordingly, a need exists for methods and techniques which provide improved process control, quality, yield and cost reduction. Also, there is a need to integrate the equipment time states to provide enhanced process scheduling and improved utilization of processing equipment.

SUMMARY OF THE INVENTION

The present invention provides novel techniques for semiconductor processing, particularly for wafer manufacturing. These novel techniques provide the needed improvements in process control, quality, yield, equipment scheduling and cost reduction.

In one embodiment of the present invention, a novel delta analysis technique is employed to determine if there are significant processing or performance differences between two semiconductor processing runs using the same recipe in a tool such as a wafer fab chamber. Processing parameter or metrology data of the first run are plotted versus time to obtain a graph of data, such as gas flow rate, against time. A similar graph is prepared using data from the second processing run. The graphs are overlayed in a synchronized manner, e.g. the graphs are overlayed such that they start at the same time event, such as process startup. The data of one of the overlayed graphs are subtracted from the data of the other graph thereby forming a novel delta graph. Computer implemented delta graph analysis facilities the identification, analysis and trouble-shooting of semiconductor processing and/or performance problems, such as inconsistencies between processing runs In another embodiment of the present invention, the same semiconductor processing recipe was used for production runs in two semiconductor processing chambers. Processing parameter or metrology data, such as chamber pressure, from one chamber were plotted versus time resulting in a graph of data versus time. A similar graph was prepared using data versus time from the other chamber. Subsequently, a synchronized graph overlay was prepared of the two graphs. The data of one of the overlayed graphs were subtracted from the data of the other graph, thus forming a delta graph. The delta graph was then used to determine of there were significant processing or performance differences between these chambers, when using this particular recipe. The computer implemented novel delta graph is utilized to identify, analyze or trouble-shoot performance differences between the chambers, thus leading to greater wafer fab processing uniformity, improved equipment utilization and improved wafer yield.

In yet another embodiment of the present invention, a quality control chart is prepared of a semiconductor processing run such as a test run or a standardized run. A quality control chart of a production run is then prepared using the same recipe in the same chamber. A synchronized overlay chart is prepared using the test run control chart and the production run control chart. A computer implemented delta graph is then prepared by subtracting the data of one chart from the other chart. The delta graph is analyzed to determine if there are significant differences between the production run and the test run, thus providing a method for analyzing the production run and improving wafer yield.

In still another embodiment of the present invention, a quality control chart for matching two wafer fab tools is prepared by executing a statistically significant number of process runs in these tools, using the same recipe in both tools. Computer implemented delta graphs are then constructed by plotting the same parameter from each tool versus time and subtracting the data of one tool from the data of the other tool. An analysis is then performed to determine which processing runs resulted in satisfactory tool matching performance. The delta graphs representing these runs are subsequently used to develop control limits, which can be used to evaluate the chamber matching performance of subsequent process runs.

In another embodiment of the present invention, computer integrated equipment time states are provided to facilitate manual and automatic scheduling of equipment functions and to provide an improved capability to respond to processing conditions. The time states can be enabled by a user through interactions with the computer through which the time states are integrated. In one embodiment of this invention, a service procedures module is provided which is automatically linked to one or more of these equipment time states and which is activated when one of these time states is enabled.

In yet another embodiment of the present invention, computer integrated equipment time states are integrated with the process which is executed in the equipment. Process/quality process control techniques of this process are linked to one or more equipment time states, causing the equipment to go off-line when the process is not operating within predetermined process/quality control limits.

In another embodiment of the present invention, the novel computer integrated time states are adapted to keep track of, and respond to, maintenance trigger events which automatically enable a preventive maintenance time state of a tool upon the occurrence of the trigger event. Examples of maintenance trigger events include a predetermined total wafer count and a predetermined total operating time of a tool.

Other embodiments of the present invention include digitally coded data structures stored in a memory. The data structures include delta graph methodologies and equipment time states of the present invention.

BRIEF DESCRIPTION OF THE DRAWINGS

FIG. 3 is a stack chart schematically illustrating prior art equipment time states.

FIG. 4 is a block diagram schematically showing prior art equipment time states of the stack chart illustrated in FIG. 3.

DETAILED DESCRIPTION OF THE INVENTION

While describing the invention and its embodiments, certain terminology will be utilized for the sake of clarity. It is intended that such terminology includes the recited embodiments as well as all equivalents.

Figure 1:
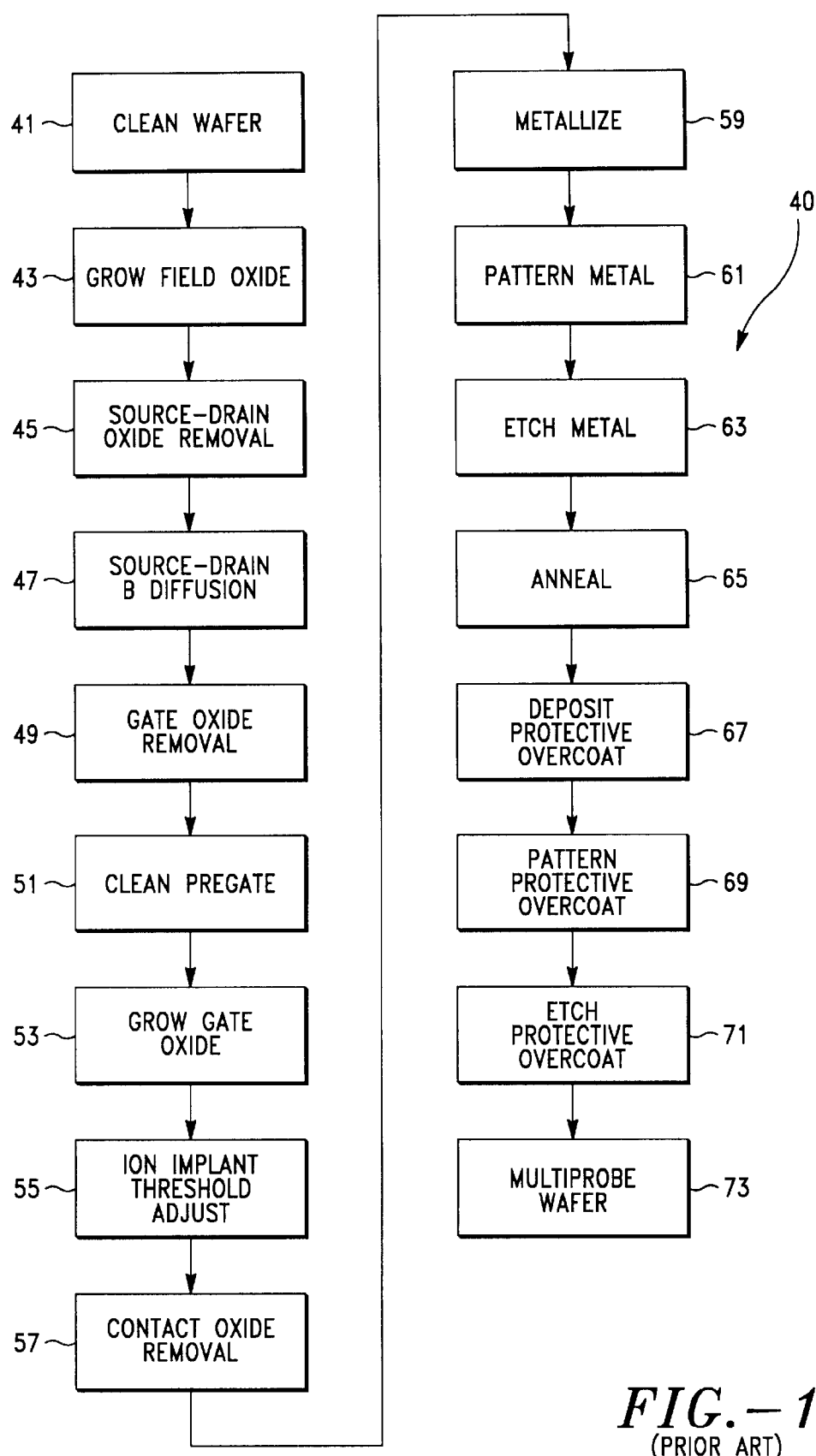
FIG. 1 is a flowchart schematically illustrating a prior art wafer fab process.
Figure 2:
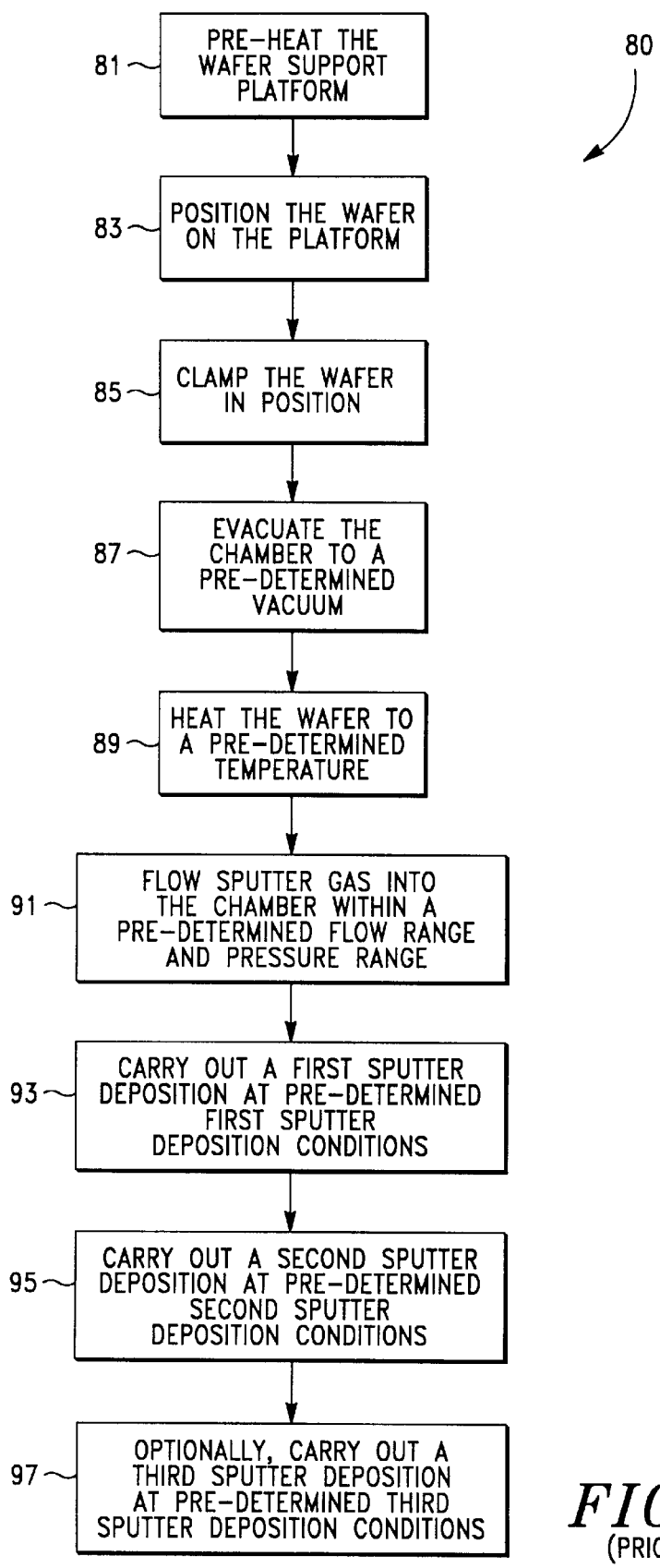
FIG. 2 is a flowchart schematically illustrating a prior art wafer fab sputter metallization process.
Figure 5:
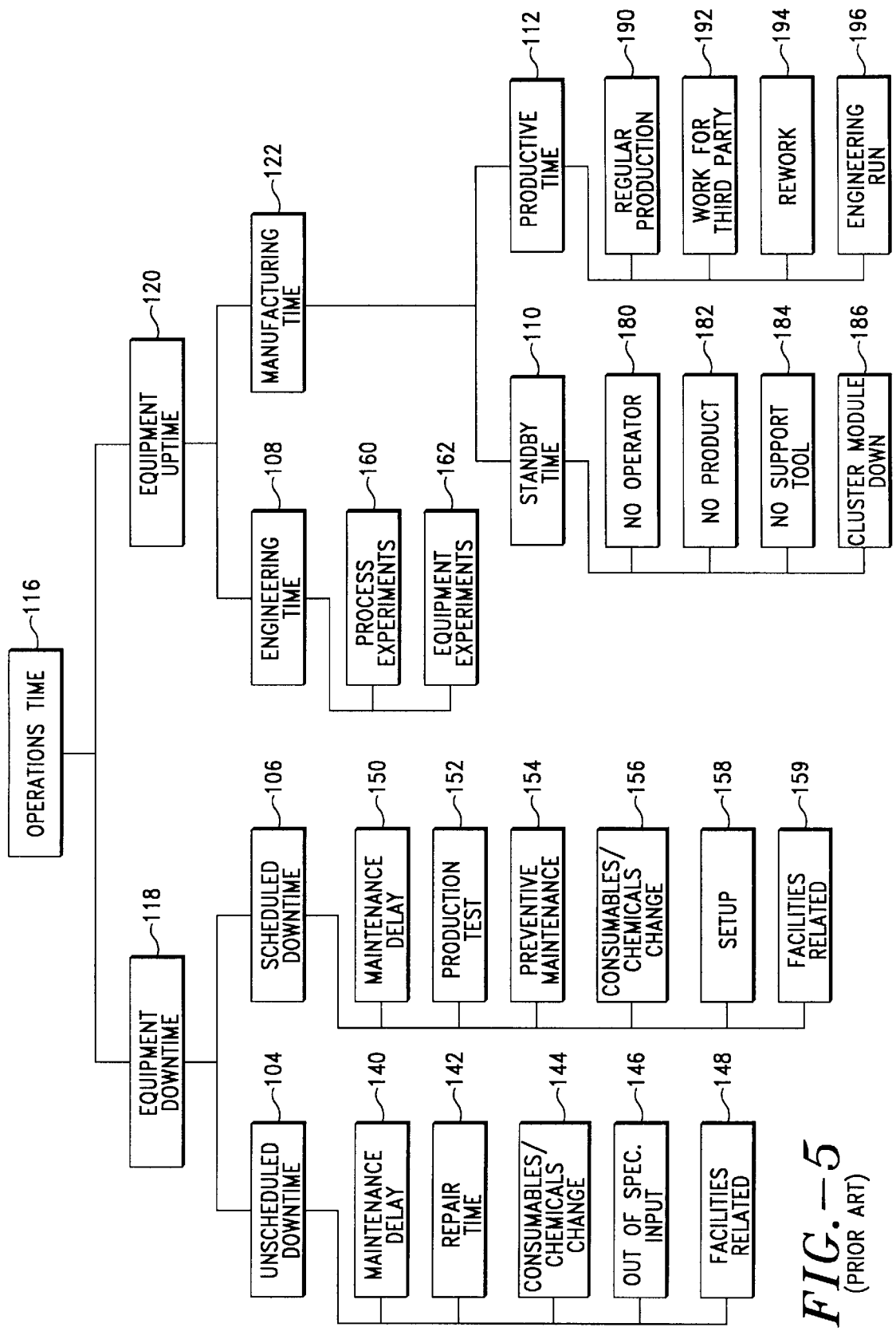
FIG. 5 is a block diagram schematically showing prior art equipment time states of the stack chart illustrated in FIG. 3.
Figure 6:
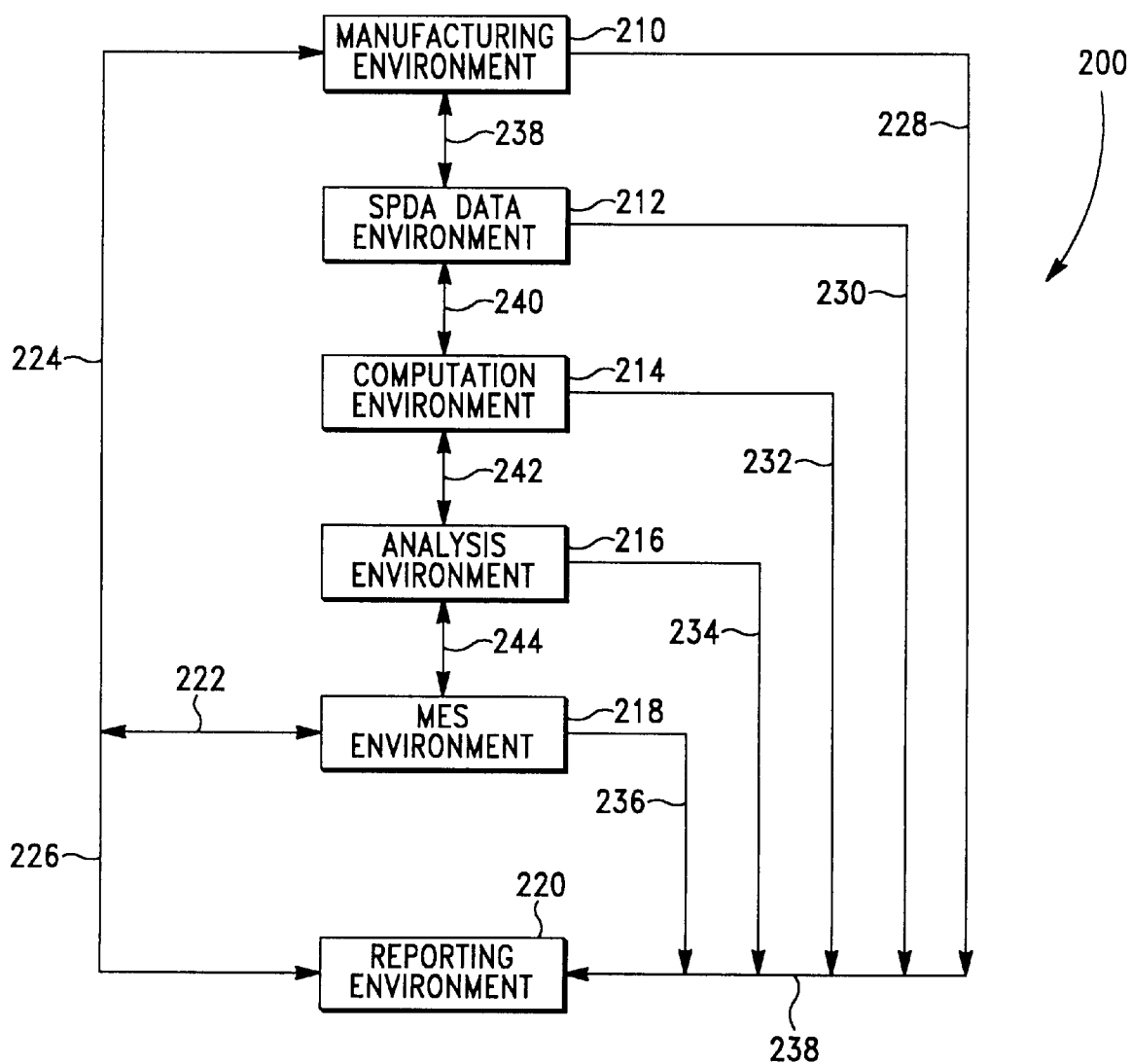
FIG. 6 is a block diagram schematically showing a semiconductor process of the present invention.

One embodiment of the invention, schematically illustrated in FIG. 6, shows a novel semiconductor process 200 employing SPDA (semiconductor process delta analysis) of the present invention. As defined herein, an SPDA includes a semiconductor processing technique wherein two graphical presentations of processing or performance data versus time are synchronized and overlayed. The data of one graph are then subtracted from the data of the other graph, thereby providing a delta graph as will be described more fully in connection with FIGS. 10–17. As used herein, SPDA is suitable for analyzing the performance of one specific tool, a combination of several tools, a cluster tool, a wafer fab or several wafer fabs. Novel semiconductor process 200, shown in FIG. 6, includes a manufacturing environment 210, an SPDA data environment 212, a computation environment 214, an analysis environment 216, an MES environment 218 and a reporting environment 220. The expression "environment" as defined herein, includes an aggregate of technologies, methods an/or devices which provide a resource for acquiring data, data structures or information and which, optionally, can interact with the acquired data, data structures or information. An environment as used herein, includes a computer environment. The expression "computer environment" as defined herein, includes computer software and/or hardware which provides a resource for acquiring data, data structures or information and which can interact with the acquired data, data structures or information.

Manufacturing environment 210, depicted in FIG. 6, includes manufacturing apparatus, techniques and methods to manufacture wafer fab devices or device components such as IC structures. The expression "IC structures" as defined herein, includes completely formed ICs and partially formed ICs. The manufacturing environment includes such controllers and inputs as are necessary to form the IC structure. Suitable controllers include processors for example micro processors such as on-board computers, computer operated software and mechanical/electrical controllers such as switches and electrical circuits employing for example a variable resistor such as a potentiometer. These controllers operate or control various processes and operational functions, such as gas flow rate and wafer handling within manufacturing environment 210. Suitable examples of manufacturing environments such as 210 include a wafer fab tool, such as a chamber, a combination of several tools, a cluster tool, or one or more wafer fabs.

SPDA data environment 212, depicted in FIG. 6, is adapted for receiving information from manufacturing environment 210. This information can include processing information and run or wafer ID information. Information such as for example chamber pressure during all or part of a processing run can be collected during specific time intervals using methodologies or techniques such as are well known to those of ordinary skill in the art. Computation environment 214, for example using a data processor, is employed to chart or plot the information collected in SPDA data environment 212. Data, such as chamber pressure data, can be charted versus time for a particular run, or for the processing of a specific wafer. The data collection and charting process can be repeated for several processing runs. Graphs or charts thus obtained can be employed to develop an SPDA by synchronizing the graphs to a common processing event, such as a startup event, and subtracting the pressure data of one graph from the data of the other graph at each of the time intervals of the chart. This subtraction process results in a delta graph wherein the subtraction results are plotted versus time. The term "delta graph" as defined herein includes a graph resulting from the subtraction of one graph from another graph in a synchronized overlay of the graphs, as will be described more fully in connection with FIGS. 10 and 12–15. The term "synchronized" as defined herein includes a charting technique wherein two graphs are overlayed such that they share a common event or datapoint which coincides when the graphs are overlayed. The term "shared event" as defined herein includes an event or datapoint which is common to two or more graphs, such as for example an event wherein time equals zero at the startup of a process wherein data are plotted versus time.

Analysis environment 216, see FIG. 6, is provided to analyze the delta graphs. For example, when two processing runs are identical the resulting delta graph is a substantially straight line which is approximately parallel to the time axis of the graph and wherein each data point on the graph has a value of about zero. Any statistically significant deviation from a substantially straight line indicates that there are differences between the two processing runs, thereby indicating a possible processing and/or equipment problem or malfunction. SPDA thus assists in the identification and troubleshooting of semiconductor processing techniques and/or equipment performance. While analysis environment 216 is shown as a separate environment, it is also contemplated to incorporate the analysis environment in SPDA data environment 212 or in computation environment 214.

MES (manufacturing execution system) environment 218, shown in FIG. 6, provides the information, control, decision making and coordinating functions of the production related activities of novel semiconductor process 200. MES environment 218 acquires the results of the SPDA analysis as determined in analysis environment 216. The MES environment then determines whether the process of manufacturing environment 210 is within or outside the predefined processing parameters or processing criteria. A decision making function in MES environment 218 can then be invoked to decide whether or not to initiate intervention in manufacturing environment 210. Such intervention can include aborting the run, adjusting parameters such as chamber pressure, scheduling additional wafers for processing or scheduling repair or maintenance activities. This intervention can be executed through links 222 and 224 of process 200, as shown in FIG. 6. Optionally, process 200 is provided with a reporting environment 220 to acquire data and other information from the environments of the present invention, for example using links 228, 230, 232, 234 236 and 238 depicted in FIG. 6. Also, when MES environment 218 is linked to manufacturing environment 210, a report can simultaneously be generated using link 226 to reporting environment 220. The above described links as well as links 238 (FIG. 6), 240, 242 and 244 include hard wire connections, wireless connections and links which are provided by manually communicating data and information between the various environments of process 200. These linking techniques are well known to those of ordinary skill in the art.

Figure 7:
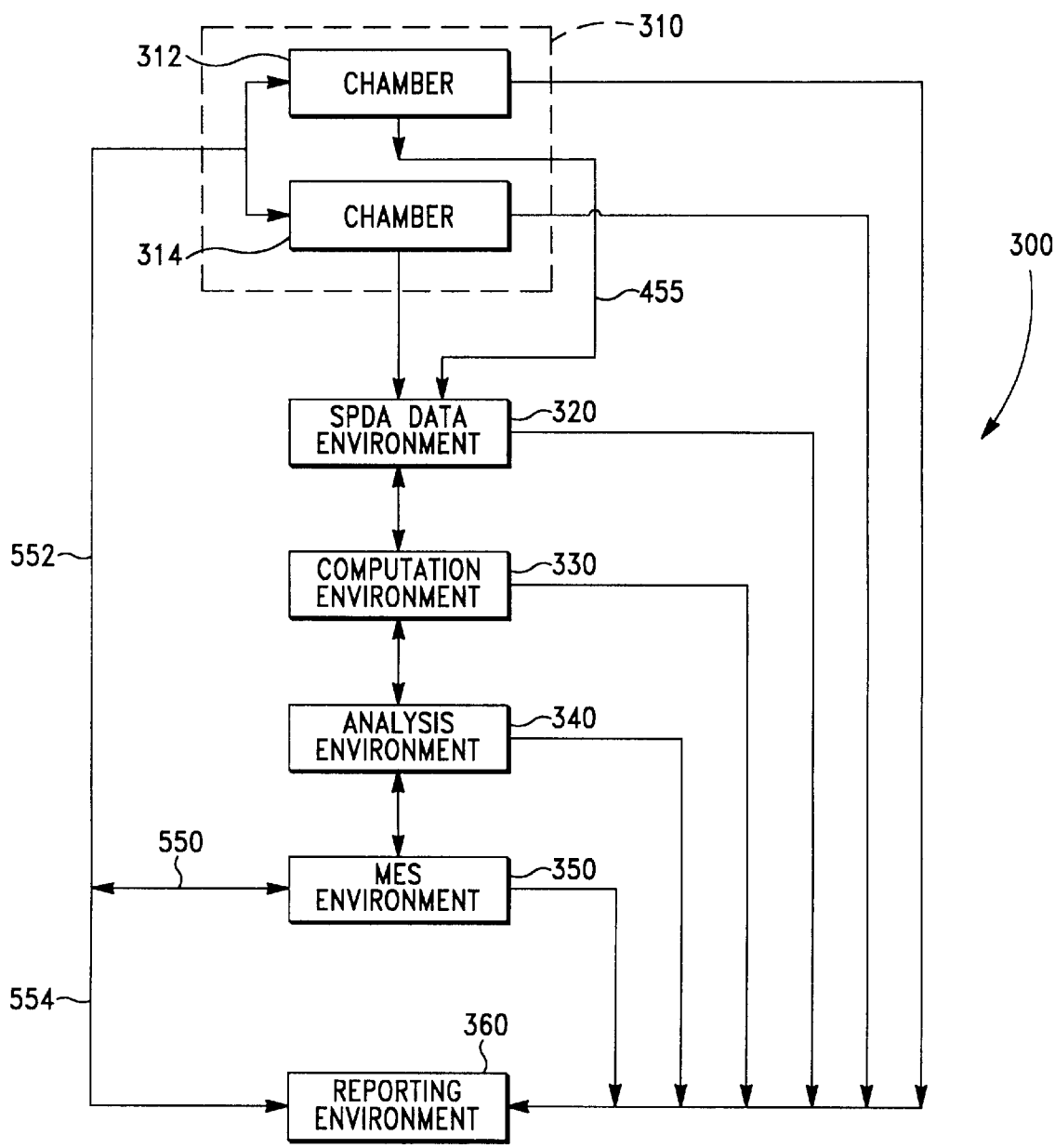
FIG. 7 is a block diagram schematically showing another semiconductor process of the present invention.

FIG. 7 is a schematic illustration of another embodiment of the present invention showing novel semiconductor process 300 employing SPDA of the present invention, employing two wafer processing chambers. Process 300 includes a manufacturing environment 310, comprising wafer processing chambers 312 and 314, an SPDA data environment 320, a computation environment 330, an analysis environment 340, an MES environment 350 and a reporting environment 360. Optionally, the MES environment can also include an MIS (management information system) component (not shown). Preferably, environments 320, 330, 340, 350 and 360 comprise computer environments.

Figure 8:
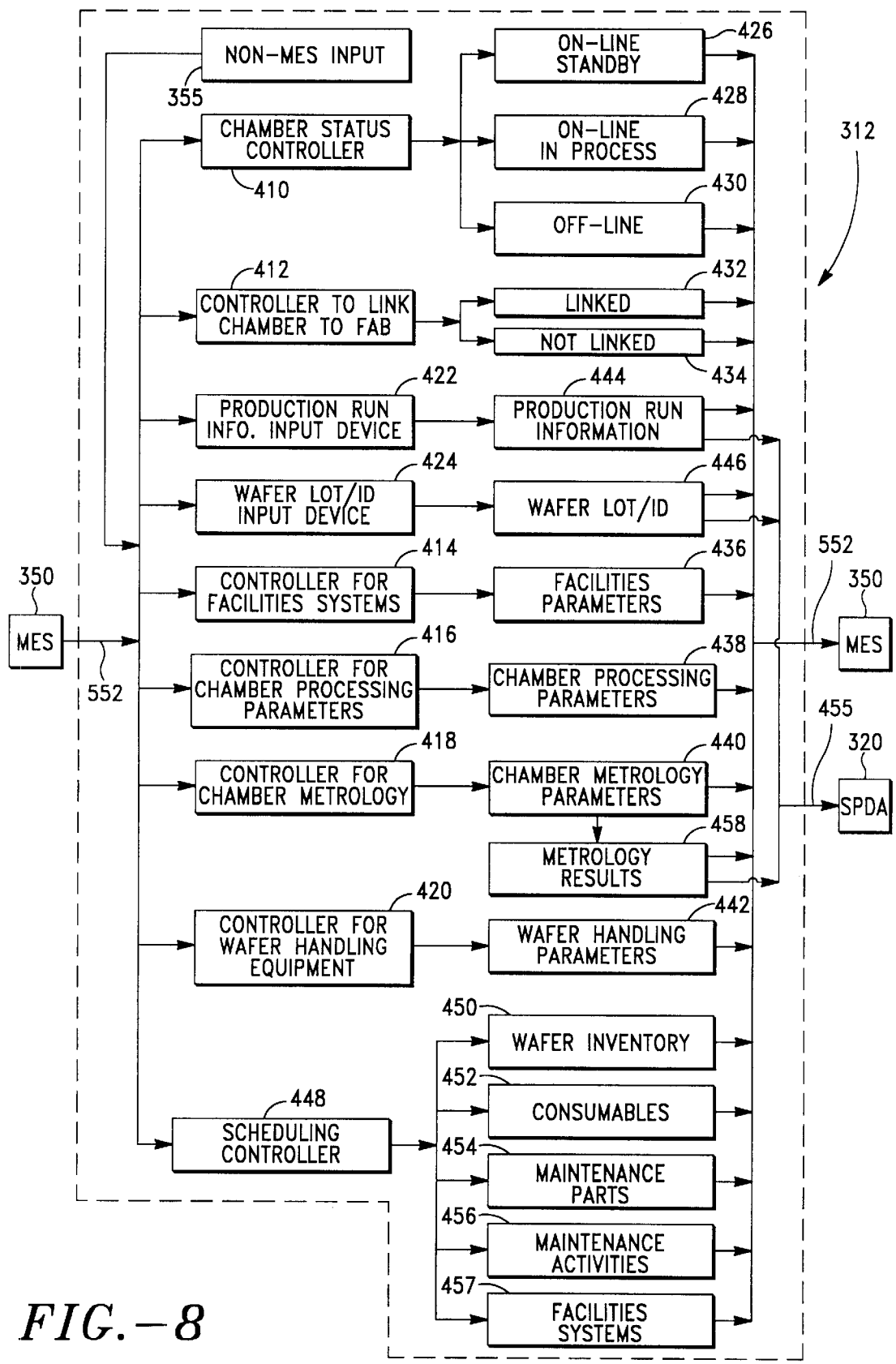
FIG. 8 is a block diagram schematically showing a wafer fab chamber of the process illustrated in FIG. 7.

FIG. 8 illustrates wafer processing chamber 312 of novel process 300 which receives various inputs from MES environment 350, for example setting or regulating chamber controllers such as controllers 410, 412, 414, 416, 418 and 420, and providing information to input devices 422 and 424. Based on MES input from MES environment 350, chamber status controller 410 is employed to select the status of the chamber: on-line in standby 426, on-line in process 428 or off-line 430. Controller 412 is utilized to select the chamber status as linked 432 or not linked 434 to a wafer fab system (not shown). Controller 414 controls parameters 436 of the facilities systems, such as electrical power, water and waste product removal. Controller 416 controls chamber processing parameters 438, such as process gas flow rate and pressure. Chamber metrology parameters 440 are controlled by controller 418, these include controlling in-process test parameters such as for example the '297 sputter deposition rate monitor, and test sampling frequency. Wafer handling parameters 442, such as the operational parameters of a wafer handling robot, are controlled by controller 420. Input from MES environment 350 can also be utilized to abort a production run, for example using chamber status controller 410 to put the chamber in an off-line status and thereby stop all processing functions of the chamber.

MES environment 350, see FIGS. 7 and 8, can be utilized to provide production run information 444 by means of production run information input device 422. Such information can include run identification, date or purpose of the run, e.g. testing, production or re-work. Wafer and wafer lot identification 446 in chamber 312 of manufacturing environment 410 can be provided by means of wafer identification input device 424. Chamber metrology results 458 are obtained from the use of test procedures employing chamber metrology parameters 440. These results include for example the rate at which material is flowing from a sputter deposition source to a deposition substrate, as disclosed in the '297 patent, chamber pressure, or gas flow rate. Optionally, chamber 312 can receive additional inputs through non-MES input 355, for example a response to an alarm signal which is generated by a component of chamber 312.

Process 300 of the present invention utilizes an SPDA environment 320, as illustrated in FIG. 7, to acquire data such as in-process metrology results wafer ID or run information from chamber 312 of manufacturing environment 310. SPDA data acquisition from chamber 312 is schematically illustrated in FIGS. 7 and. 8 as follows. Production run information 444 and wafer ID 446 data as well as chamber metrology parameter information 440 and metrology results 458 can be provided to SPDA environment 320 through a link 455.

Figure 9:
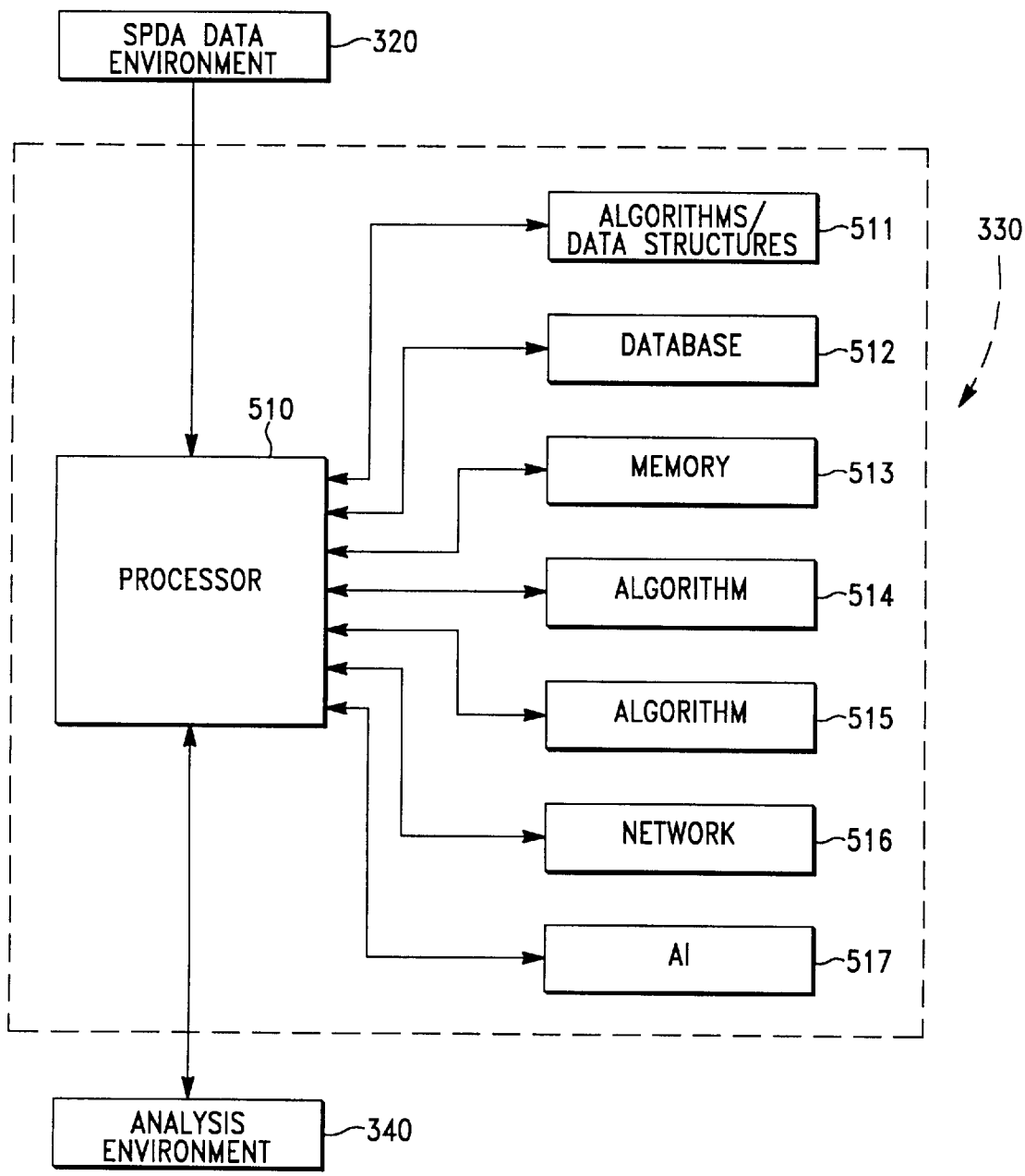
FIG. 9 is a block diagram schematically showing a computation environment of the process illustrated in FIG. 7.
Figure 10:
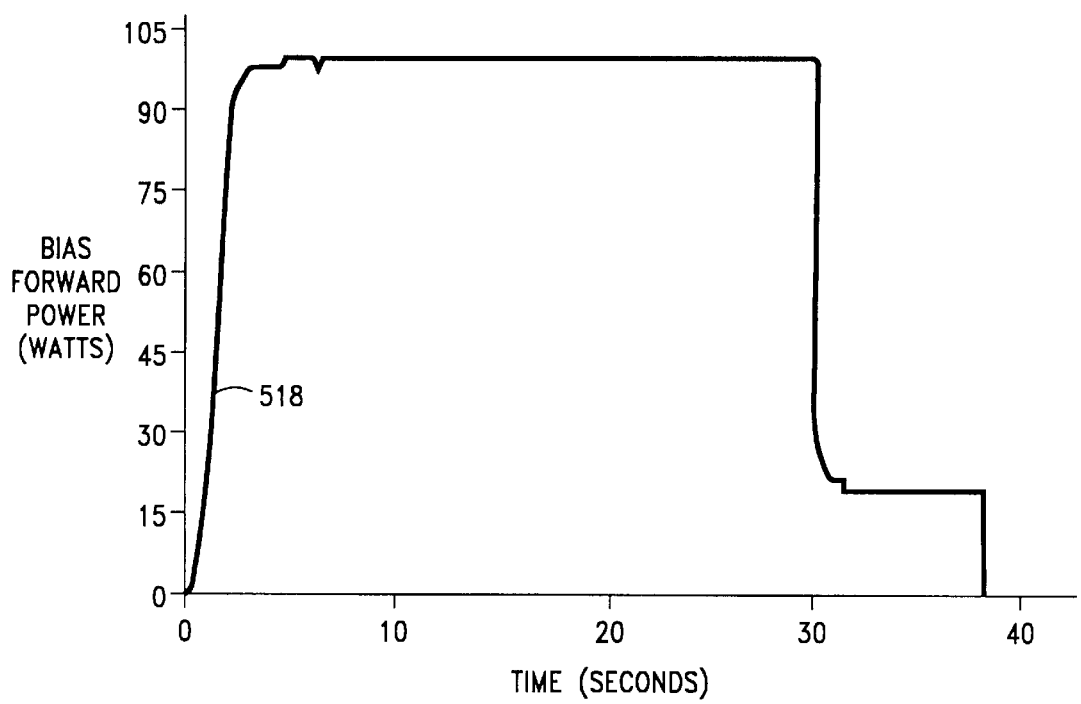
FIG. 10 is a graphical illustration of chamber bias forward power versus time, of the process illustrated in FIG. 7.
Figure 11:
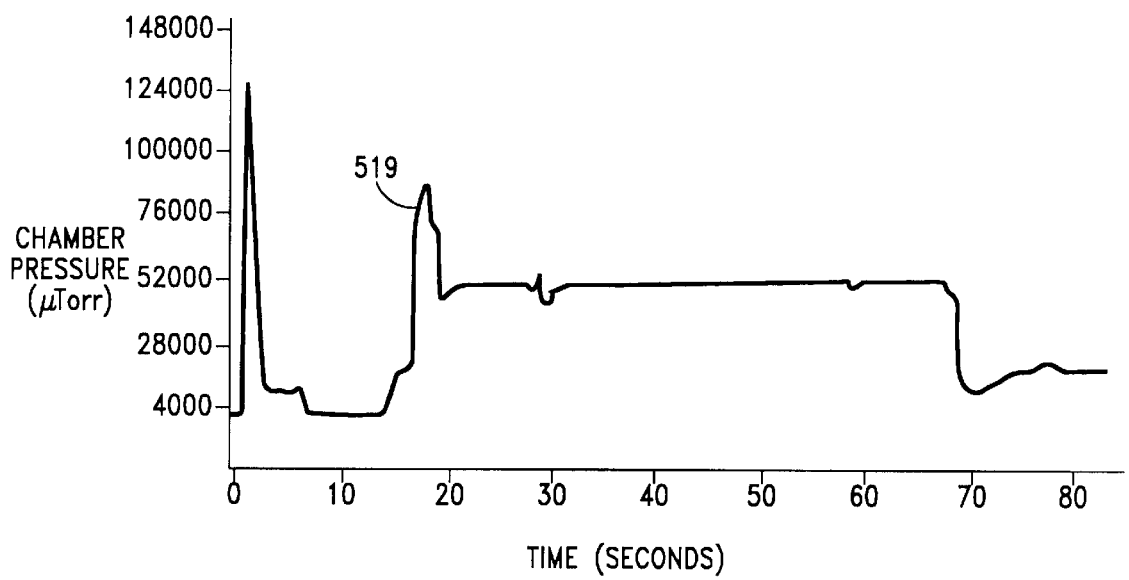
FIG. 11 is a graphical illustration of chamber pressure versus time, of the process illustrated in FIG. 7.

Computation environment 330, depicted in FIGS. 7 and 8, is utilized to perform the calculations to support the data processing and reporting of the SPDA environment, as will be described more fully in connection with FIGS. 10 and 11. As illustrated in FIG. 9, computation environment 330 typically includes a processor such as a microprocessor 510, algorithms or data structures 511, a database 512, a memory 513, a first novel algorithm 514, a second novel algorithm 515, optionally a network component 516 and optionally an AI (artificial intelligence) component 517.

Algorithms or data structures 512 (FIG. 9) are employed using methods which are well known to those of ordinary skill in the art to operate processor 510 and any peripheral devices associated with this processor, as well as for processing such information as metrology and wafer ID data which are acquired in SPDA environment 320. For example, SPDA environment 320 collected bias forward power versus time of a semiconductor etch process in chamber 312. These data were communicated to computation environment 330 using such data communication techniques as are well known to those of ordinary skill in the art. The data were then computed in the computation environment, using for example algorithms 511, to obtain graph 518, shown in FIG. 10, wherein bias forward (i.e. cathode) power is plotted versus time. Similarly, SPDA environment 320 acquired chamber pressure versus time data of an etch process executed in chamber 312. The data were computed in computation environment 330, resulting in graph 519, depicted in FIG. 11. Algorithms 511 for plotting data such as the results in graphs 518 and 519 are well known to those of ordinary skill in the art. Graphs 518 and 519 can be maintained in computation environment 330 in digital form, or can be displayed on a computer monitor. Additionally, the graphs can be provided in printed form, using for example reporting environment 360, shown in FIG. 7.

Figure 12:
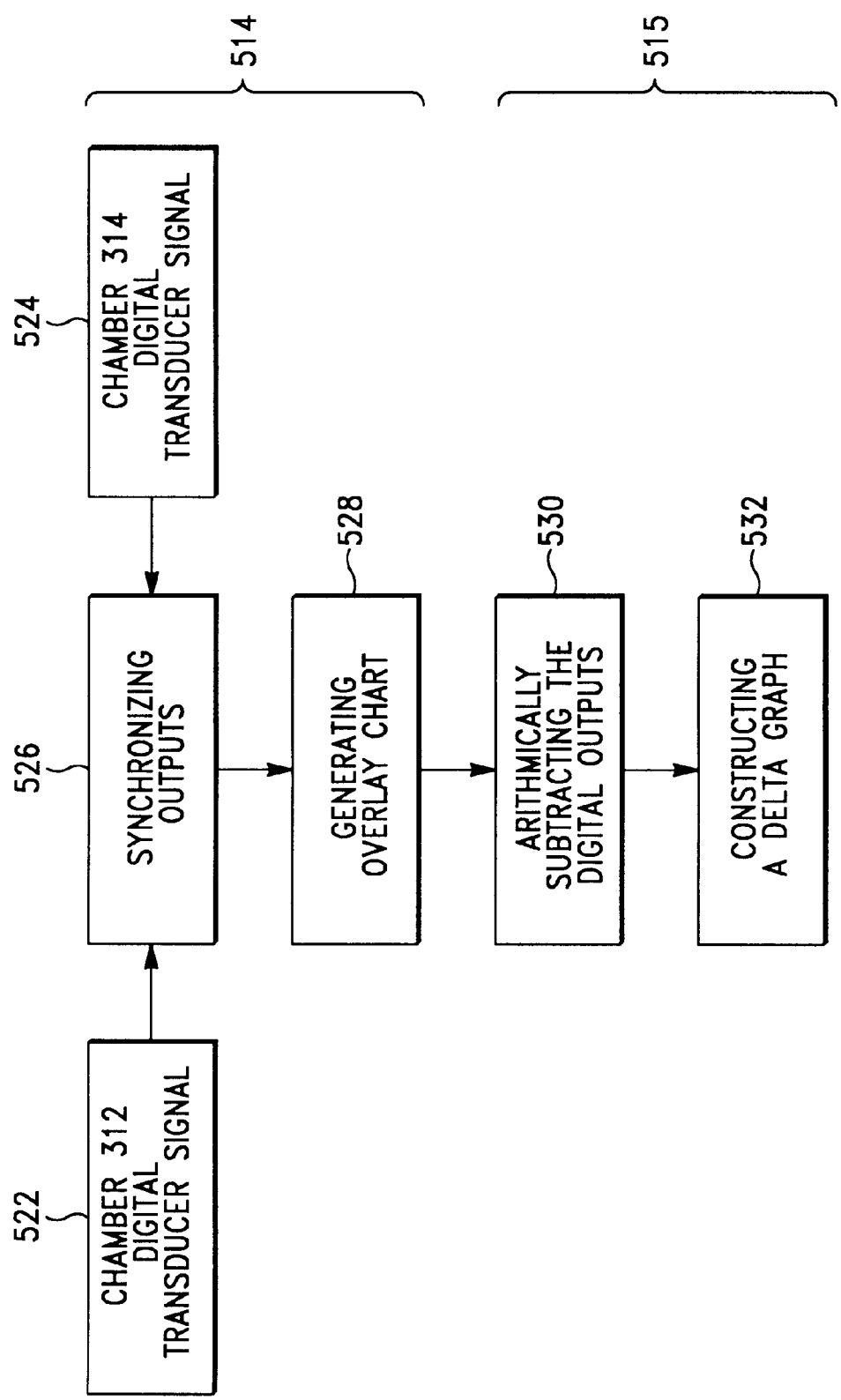
FIG. 12 is a flowchart schematically illustrating a method of constructing a delta graph of the present invention.
Figure 13:
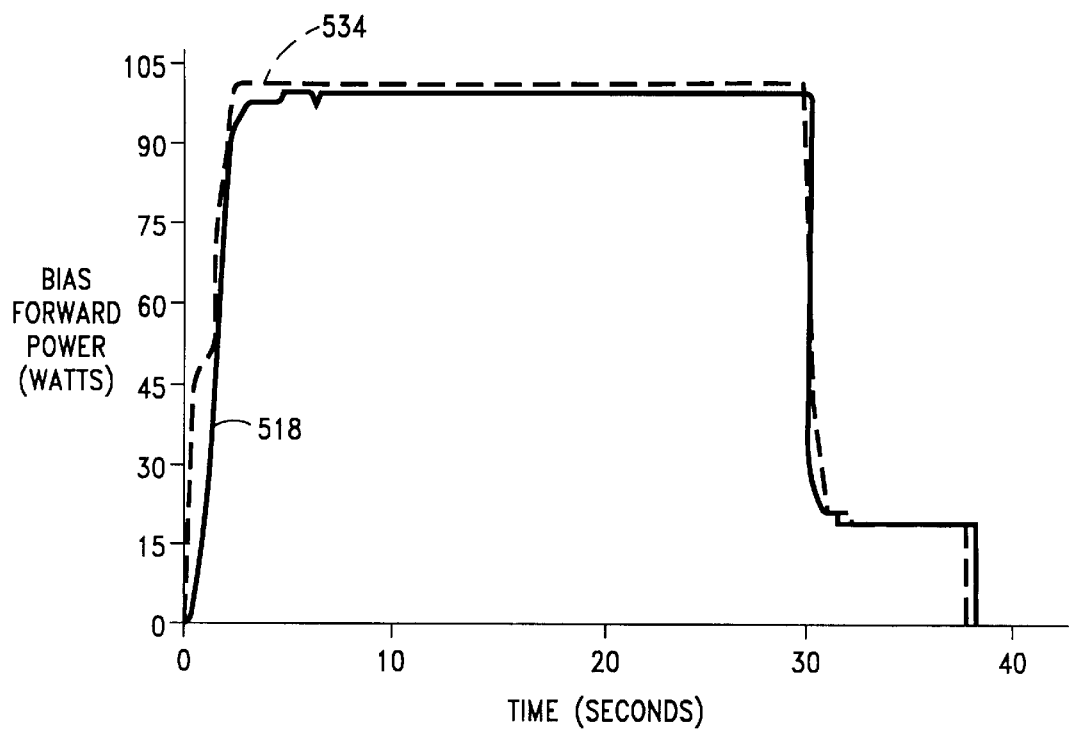
FIG. 13 is a graphical illustration of two overlayed graphs of chamber bias forward power versus time, of the process illustrated in FIG. 7.

Chamber 314, shown in FIG. 7, is similar to chamber 312, depicted in FIGS. 7 and 8. Data from chamber 314 are collected in SPDA environment 320 (FIG. 7) using techniques similar to those described in connection with FIGS. 10 and 11. Using these techniques, SPDA data environment 320 acquired bias forward power versus time data, as well as chamber pressure versus time data for the same etch processes as were used to collect these data from chamber 312. The data obtained from chamber 314 were then plotted to obtain graphs using the techniques which were employed in plotting graphs 518 (FIG. 10) and 519 (FIG. 11) concerning chamber 312. Subsequently, novel algorithm 514 (FIG. 9) was employed to make graph overlays as schematically illustrated in FIG. 12. Bias forward digital transducer signal 522 from chamber 312 and bias forward power digital transducer signal 524 from chamber 314 were synchronized in step 526. The synchronized outputs were then overlayed, see step 528, to construct an overlay of graphs 518, i.e. the bias forward power versus time graph of chamber 312 and graph 534 which is the corresponding graph from chamber 314. The synchronized overlay of graphs 518 and 534 is shown in FIG. 13.

Figure 14:
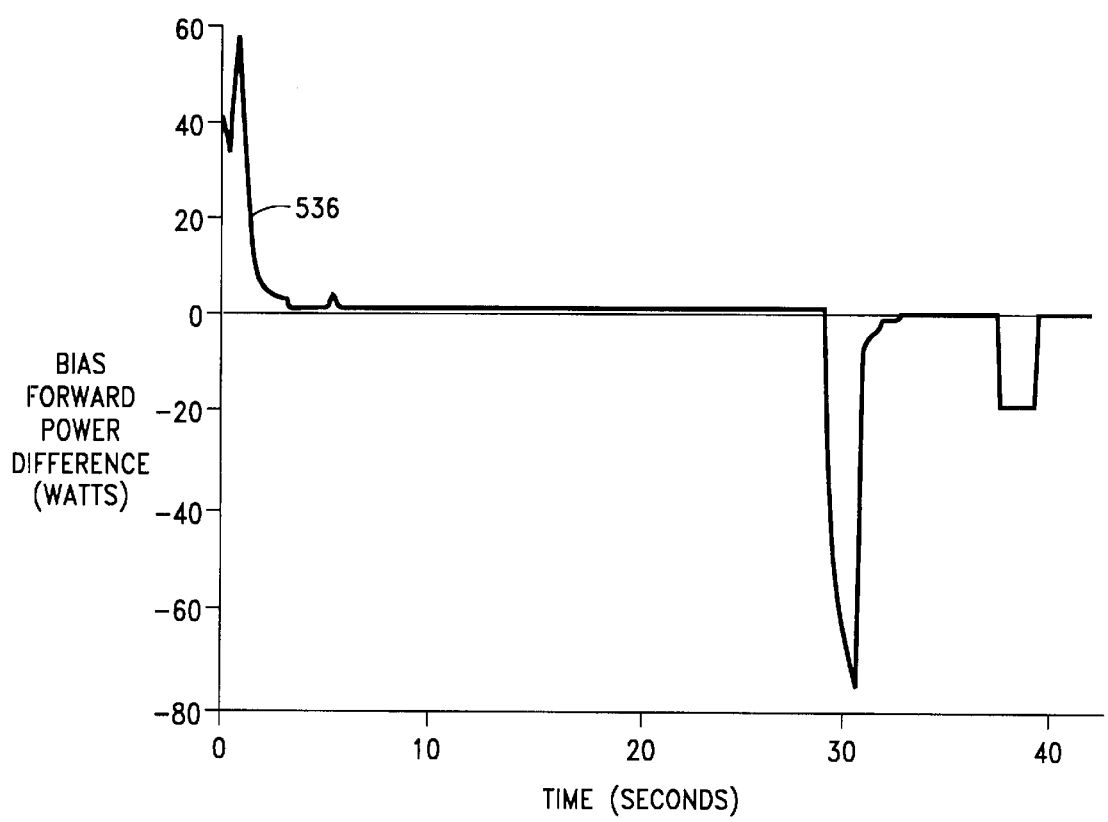
FIG. 14 is a graphical illustration of a delta graph of bias forward power difference versus time, of the overlayed graphs shown in FIG. 13.

Next, in accordance with the present invention, novel algorithm 515 (FIGS. 9 and 12) was employed to subtract the bias forward power data of graph 518 from those of graph 534 in step 530, shown in FIG. 12. In this step, the digital transducer output of chamber 312 was subtracted from the synchronized digital transducer output of chamber 314. Subsequently, a delta graph was formed in step 532 as a result of the subtraction of the transducer outputs. The resulting delta graph 536 is shown in FIG. 14. Delta graph 536 thus depicts the difference in bias forward power between chambers 312 and 314 during the etching process which was employed. It can be concluded from this graph that there were significant differences in bias forward power between chambers 312 and 314. Surprisingly, a comparison between FIGS. 12 and 13 shows that the performance differences between chamber 312 and 314 are more clearly shown in delta graph 536 (FIG. 14) of the novel SPDA, then they are in the overlay of graphs 518 and 534 (FIG. 13).

Figure 15:
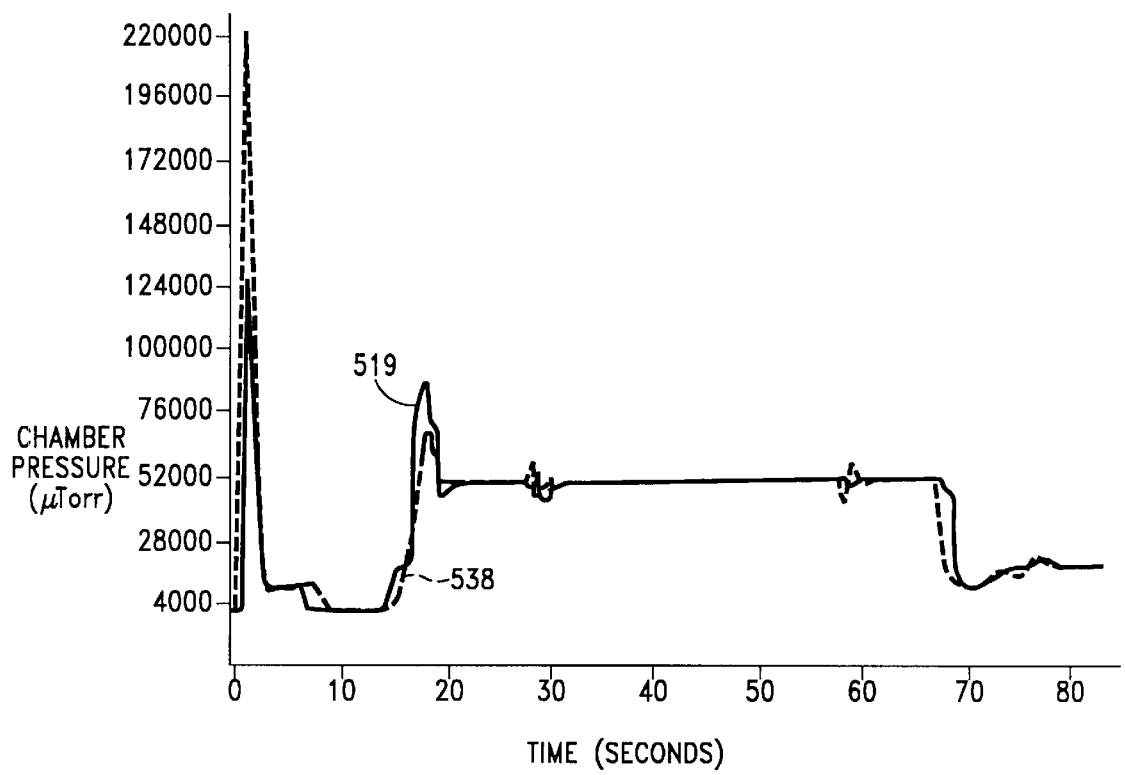
FIG. 15 is a graphical illustration of two overlayed graphs of chamber pressure versus time, of the process shown in FIG. 7.
Figure 16:
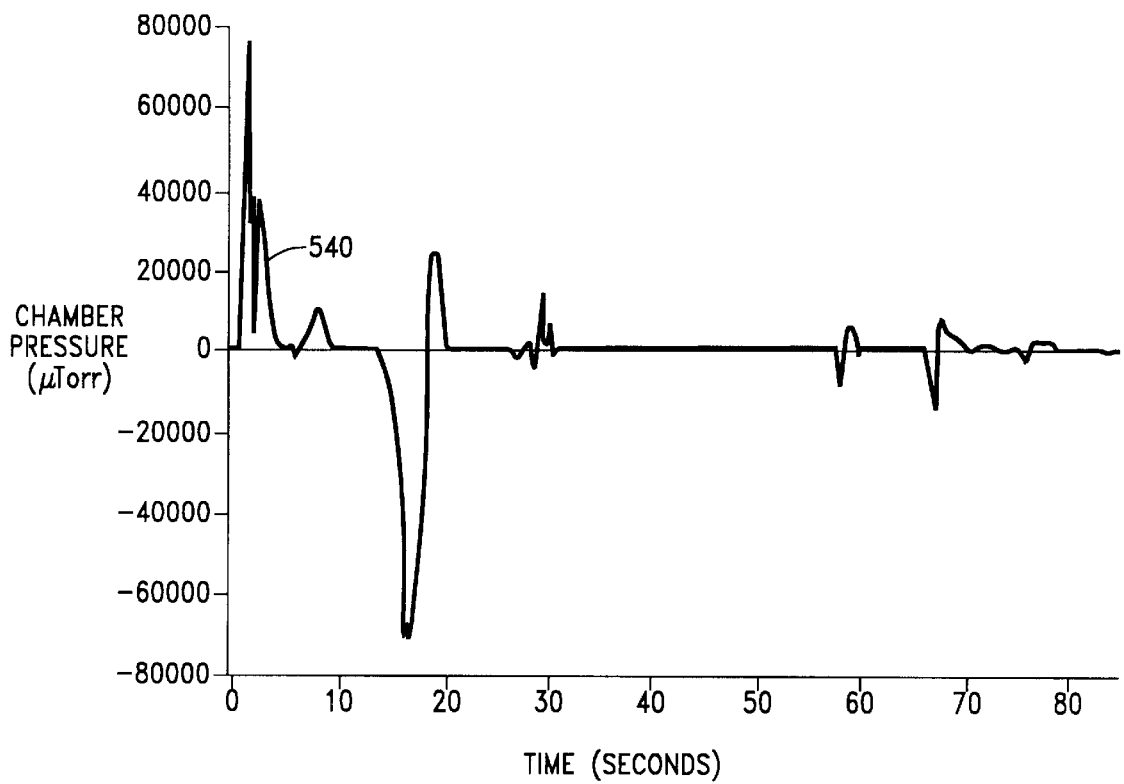
FIG. 16 is a graphical illustration of a delta graph of chamber pressure difference versus time, of the overlayed graphs shown in FIG. 15.

The techniques and methods which were used to prepare the graph overlay of graphs 518 and 534 were similarly used to prepare graph overlays of chamber pressure versus time for chambers 312 and 314. As illustrated in FIG. 15, a synchronized overlay was prepared of graph 519 (FIG. 11), i.e. chamber pressure versus time of the etching process of chamber 312, and graph 538 representing chamber pressure versus time of chamber 314. Delta graph 540, see FIG. 16, of the present invention was prepared by subtracting the chamber pressure data of graph 538, i.e. chamber 314, from those of graph 519, i.e. chamber 312. A comparison between the overlay graphs shown in FIG. 15 and the delta graph depicted in FIG. 16 illustrates more clearly that there were pressure performance differences between chambers 312 and 314.

Figure 17:
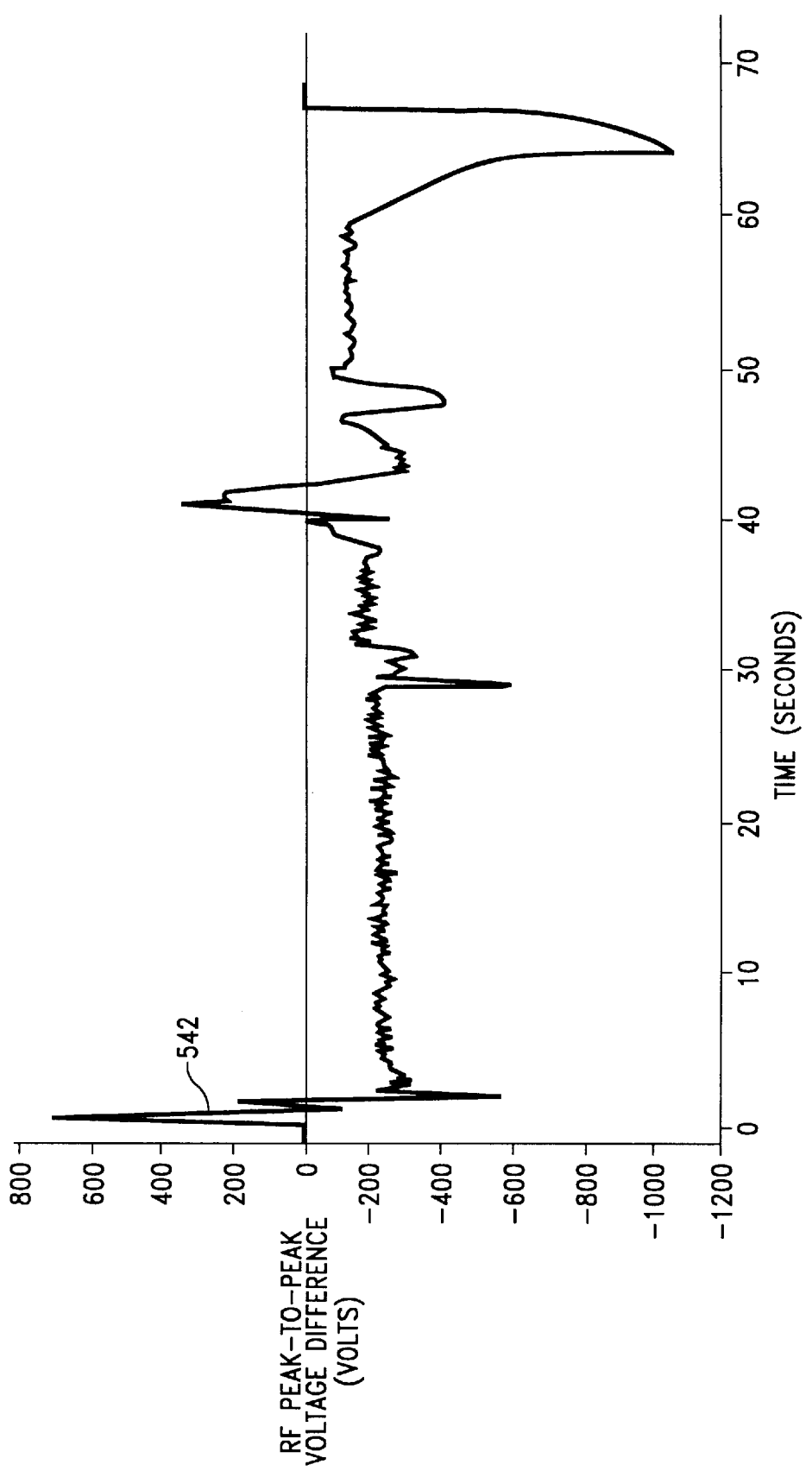
FIG. 17 is a graphical illustration of a delta graph of chamber RF peak-to-peak voltage difference, of the process shown in FIG. 7.

Delta graph 542 shown in FIG. 17, was obtained by employing the SPDA techniques of the present invention. This delta graph is the result of the subtraction of the RF peak-to-peak voltage (i.e. the total voltage drop across a source coil) versus time graphs of two processing chambers similar to chambers 312 and 314 using the same recipe, employing the methods and techniques described in connection with FIGS. 10–16. Delta graph 542 shows significant performance differences between the two chambers in regard to the RF peak-to-peak voltage.

Returning to FIG. 9, database 512 of computation environment 330 can contain chamber parameter, metrology and wafer ID or run data. Memory 513 can for example be used to store in-process metrology data. Optional network component 516 provides a link between novel process 300 and external entities such as a remote database or a remote management function using for example a bus or a LAN (local area network). Optional AI component 517 can for example be used to process the data stored in database 512 to select metrology parameters and data, based on experience gained over many production runs. Computation environment 330, as described herein, is utilized in conjunction with SPDA methodologies and procedures of the present invention. However, it is also contemplated to use this computation environment for any and all functions of processes carried out in connection with manufacturing environment 310. Links between the various environments of novel process 300 are schematically illustrated in FIG. 7. These links include hard wire connections, wireless connections and links which are provided by manually communicating data and information between the various environments of process 300. These linking techniques are well to those of ordinary skill in the art.

It is also contemplated to provide a novel product or a novel apparatus comprising one or more digitally coded data structures including novel algorithms 514 and 515 (FIG. 12) stored in a memory. Suitable memories for this novel product include removable electronic data storage devices, such as computer disks, magnetic tapes and optical disks. Suitable memories for a novel apparatus include data processing devices, such as computers, having a memory.

As schematically shown in FIGS. 7 and 9, an analysis environment 340 is provided to analyze the results of the SPDA techniques of the present invention to identify, trouble-shoot or correct processing or equipment problems in IC processing. For example, an analysis of delta graphs 536, 540 and 542 shown in FIGS. 14, 16 and 17 respectively, indicate that there are significant performance differences between chambers 312 and 314 of manufacturing environment 310 depicted in FIG. 7. This means that adjustments need to be made in the processing parameters of one of the chambers, or of both chambers, in order to match chambers. Such chamber matching can be important in wafer yield enhancement and scrap reduction, as well as reducing the time which is required to ready a wafer fab for production. While analysis environment 340 has been shown as an environment which is separate from the other environments of this invention, it is also contemplated to integrate analysis environment 340 with computation environment 330 (FIG. 7) or with SPDA data environment 320. It is, for example, contemplated to include SPDA environment 320, computation environment 330 and analysis environment 340 within one computer environment.

The results of the analysis performed in analysis environment 340 are acquired MES environment 350, as is schematically illustrated in FIG. 7. When the analysis shows that chamber 312 and 314 do not meet a predetermined matching processing performance or processing criteria, an MES decision is made to intervene in the process. This intervention can be an automated/closed loop intervention from MES environment 350 to chambers 312 and 314 using for example links 550 and 552 which are schematically depicted on FIG. 7. Optionally, a non-automated intervention can be executed using the same links. Such intervention can include adjusting processing parameters, conducting equipment maintenance or repair of chamber 312 and/or chamber 314. Optionally, non-automated MES intervention can be executed using these links.

As schematically illustrated in FIG. 8, automated and non-automated MES intervention with chamber 312 can be executed through controllers 410, 412, 414, 416, 418 and 420, as well as information input devices 422 and 424. Typically, a wafer fab tool such as chamber 312 employs an on-board computer or distributed computer function in order to operate or control various processes and operational functions and it will be understood that MES environment 350 (FIG. 7) and SPDA data environment 320 may require special protocols in order to access chamber 312. Reporting environment 360 can acquire data and other information from the various environments of the present invention, as is schematically illustrated in FIG. 7. For example, when MES environment 350 is linked to chamber 312 through bidirectional links 550 and 552, a report can simultaneously be generated in reporting environment 360 through link 554.

Reports generated by reporting environment 360 include printed matter, display on a computer monitor and voice. These reports can be generated in real time. It is also contemplated to provide reports generated by this environment to a network such as network 516 shown in FIG. 9.

SPDA techniques of the present invention have been described in connection with a processing or performance comparison between two IC processing chambers, these techniques are equally suitable for use with one chamber. For example, two processing runs can be executed in one chamber using the same processing recipe. The SPDA delta graph resulting from the same parameters of the two processing runs can then be utilized to determine if there are significant run-to-run processing or equipment performance problems. Similarly, the chamber performance of a production run can be compared with a test run through the use of an SPDA delta graph of the production run and the test run. The SPDA data of a test run or a run which is made under standardized conditions can be stored in a database such as database 513 (FIG. 9) of novel process 300. These database data can then be used in a subsequent SPDA analysis of a production run.

Additionally, the SPDA techniques of the present invention are equally suitable for evaluating metrology data concerning in-situ product testing. For example, using the technology disclosed in U.S. Pat. No. 5,698,989 (J. Nulman, 1997) for measuring the sheet resistance of an electronically conductive film on a semiconductor susbstrate in-situ, while maintaining the substrate within the vacuum environment of the semiconductor process apparatus. The SPDA data environment of the novel IC fabricating process can collect the sheet resistance data of a test run or a run made under standardized processing conditions. Subsequently, the SPDA data environment can collect sheet resistance data of a production run using the same recipe. The data can then be processed using the SPDA techniques described in connection with graphs 518 through 542, shown in FIGS. 10–17, to derive one or more SPDA delta graphs of the present invention. The delta graphs can be analyzed to determine if there are significant differences between the test run and the production run thus providing a technique for improving process control and wafer yield.

Figure 18:
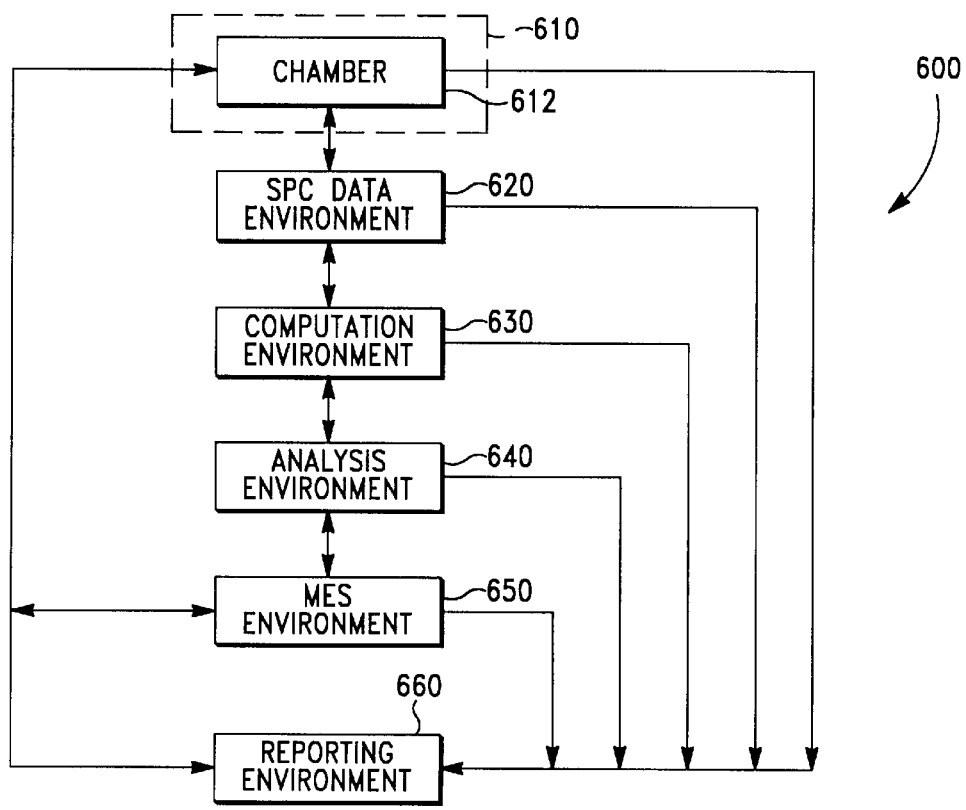
FIG. 18 is a block diagram schematically showing an additional semiconductor process of the present invention.

Another embodiment of the present invention is shown in FIG. 18, schematically illustrating novel process 600 for IC fabricating. This process utilizes SPDA techniques of the present invention in conjunction with using such processing criteria as SPC techniques. Process 600 includes a manufacturing environment 610, an SPC data environment 620, a computation environment 630, an analysis environment 640, an MES environment 650 and a reporting environment 660. Optionally, the MES environment can also include an MIS component (not shown).

Manufacturing environment 610 of novel process 600 includes a chamber 612 (FIG. 18) for IC processing, similar to chamber 312 described in connection with FIG. 8. SPC data environment 620 collects SPC data from chamber 612, similar to the techniques described in connection with SPDA data acquisition in SPDA environment 320 of novel process 300 shown in FIG. 7. The SPC data can then be utilized to, for example, develop control charts.

SPC methodologies suitable for the present invention include control chart methodologies and Pareto charts. A Pareto chart is a bar chart representation which displays a ranking of the number of occurrences of a particular defect as compared with the cumulative number of occurrences of all defects and the number of occurrences of each of the other defects or problems. Control charts are particularly suitable for techniques of the present invention. As is well known to those of ordinary skill in the art, control limits are typically determined following the collection of a statistically significant number of data, which are relevant to an important or critical parameter indicative of the process operating as designed and resulting in an acceptable yield. A suitable parameter for a process carried out in manufacturing environment 610 can include sputter power in a sputter deposition process, gas flow rate and/or pressure, and particle contamination in the chamber environment. Metrology data measuring these parameters at specific intervals provide the input for the determination of control limits. Additionally, metrology data concerning in-situ product testing can be used in a similar way. For example using the technology disclosed in the '989 patent for measuring the sheet resistance of an electrically conductive film on a semiconductor substrate in-situ, while maintaining the substrate within the vacuum environment of the semiconductor process apparatus. The data which are obtained from the process while running in control, i.e. within operational specification and/or yield, are then computed to determine the process control limits using statistical methods which are well known to those of ordinary skill in the art. Subsequent production runs are then analyzed using metrology data of the same processing or in-situ product parameters as were used to determine the control limits.

The SPC data in SPC data environment 620 are communicated to computation environment 630, which processes the SPC data to determine the control limits for the process which was executed in chamber 612. These data processing techniques are well known to those of ordinary skill in the art. SPC data regarding production runs in chamber 612 are then collected in SPC environment 620, using the same recipe as was used to determine the control limits, and evaluating the same processing parameter or chamber metrology. These production run data are processed in computation environment 630 to provide control charts, using methods and techniques which are well known to those of ordinary skill in the art. Computation environment 630 is employed to provide a synchronized graph overlay of two of these control charts. The graph overlay is then processed in computation environment 630 to provide a delta graphs, using techniques similar to those employed for the preparation of delta graphs 536, 540 and 542 shown in FIGS. 14, 16 and 17. Subsequently, the delta graph is analyzed in analysis environment 640 to determine if there are significant processing or performance differences between the two production runs. The result of the analysis is communicated to MES environment 650 to decide on a course of action, if any, for process intervention of chamber 612 based on the presence or absence of significant processing or performance differences between the two production runs. The SPDA technique of the present invention wherein SPDA is employed in conjunction with SPC is thus suitable for identifying and evaluating processing and/or performance differences between production runs in a processing chamber, thereby enhancing wafer yield and providing a more optimal usage of processing materials and equipment. Reporting environment 660 (FIG. 18) is adapted for generating reports from the environments of novel process 600, similar to the reports described in connection with reporting environment 360 of novel process 300.

In another embodiment of the present invention, SPDA techniques are employed for novel SPC methodologies wherein control charts are based on delta graphs as follows. A delta graph for example resulting from a performance comparison of two chambers, such as chamber 312 and 314 (FIG. 7), may indicate that there are significant performance differences between these two chambers as illustrated in delta graphs 536, 540 and 542 shown in FIGS. 14, 16 and 17 respectively. Each of these delta graphs differs from the substantially straight line which would have resulted if there had been no significant performance differences between chambers 312 and 314 for the parameters which were tested, i.e. bias forward power, chamber pressure and RF peak-to-peak voltage. The novel SPC methodologies of the present embodiment are provided to determine process or product control limits and to optionally provide an automated process intervention technique if these limits indicate that the process is operated outside the control limits.

An SPC delta graph control chart according to the present invention is prepared by collecting a statistically significant number of delta charts for a specific comparison for example between two processing chambers, between two processing runs in the same chamber, or between two lots of semiconductor structures fabricated in the same wafer fab tools. The delta graphs which are obtained from the process while running in control, i.e. within operation specification and/or yield, are then computed to determine the process control limits using statistical methods which are well known to those of ordinary skill in the art. For example, historical data collected from delta graphs of chamber comparisons using bias forward power differences, such as are illustrated in graph 536 shown in FIG. 14, can be used to determine the range of bias forward power differences which were observed when the chambers were known to be acceptably matched. This range can then be used to set control limits indicating a satisfactory performance match between these chambers. The delta graph of any subsequent comparison between chambers can then be evaluated to determine if the graph is within the predetermined control limits. This evaluation can be conducted visually by showing the predetermined control limits on the delta graph, or numerically by listing delta graph data compared with the relevant control data. Advantageously, this novel SPC technique can be used to provide an alarm when the process is not within the predetermined control limits using methods which are well known to those skilled in the art. Alternatively, an automatic process intervention such as aborting the process run can be initiated when the process is not within its control limits for example by automatically entering the alarm signal in an MES environment such as MES environment 650 which is described in connection with FIG. 18.

It is also contemplated to provide a novel product or a novel apparatus comprising one or more digitally coded data structures including the novel SPC methodologies based on the novel delta graphs stored in a memory. Suitable memories for this novel product include removable electronic data storage devices, such as computer disks, magnetic tapes and optical disks. Suitable memories for a novel apparatus include data processing devices, such as computers, having a memory.

Figure 19:
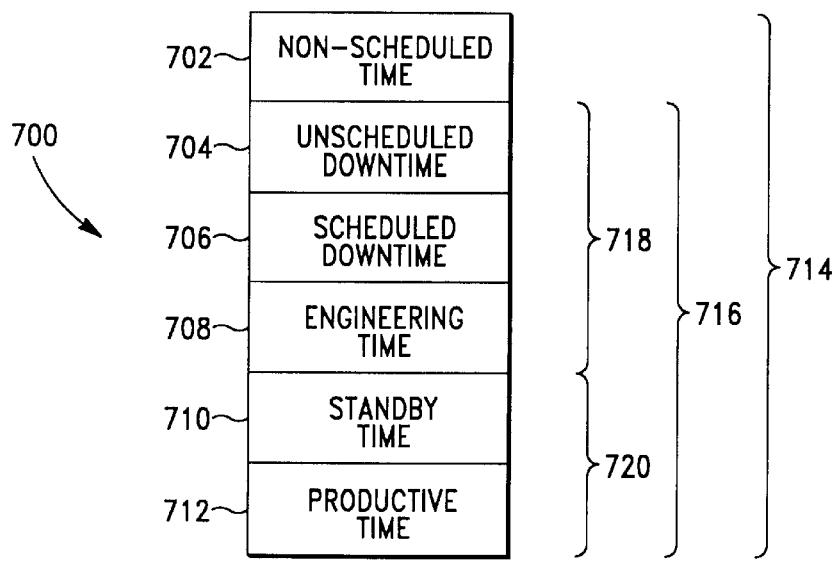
FIG. 19 is stack chart schematically showing another embodiment of the present invention.

FIG. 19 is a schematic representation of another embodiment of the present invention showing equipment time states of a wafer fab tool, such as a processing chamber, of novel semiconductor fabrication process 700. These equipment time states include non-scheduled time 702, unscheduled downtime 704, scheduled downtime 706, engineering time 708, standby time 710 and productive time 712. The description of equipment states 702, 704, 705, 708, 710 and 712 is similar to the description of states 102 (FIG. 3), 104, 106, 108, 110 and 112 respectively. States 704, 706, 708, 710 and 712 of novel process 700 are integrated within one computer environment in order to facilitate centralized manual and automatic scheduling of various equipment functions and to provide an improved capability to respond to semiconductor processing conditions, as will be described more fully in connection with FIGS. 20 and 21. Suitable computer environments include microcomputers and computer systems employing one or more computers such as are well known to those of ordinary skill in the art. Each of the computer integrated equipment states is linked to the appropriate equipment using such linking techniques as are well known to those of ordinary skill in the art, using for example a communications standard such as SECS (SEMI equipment communications standard).

Figure 20:
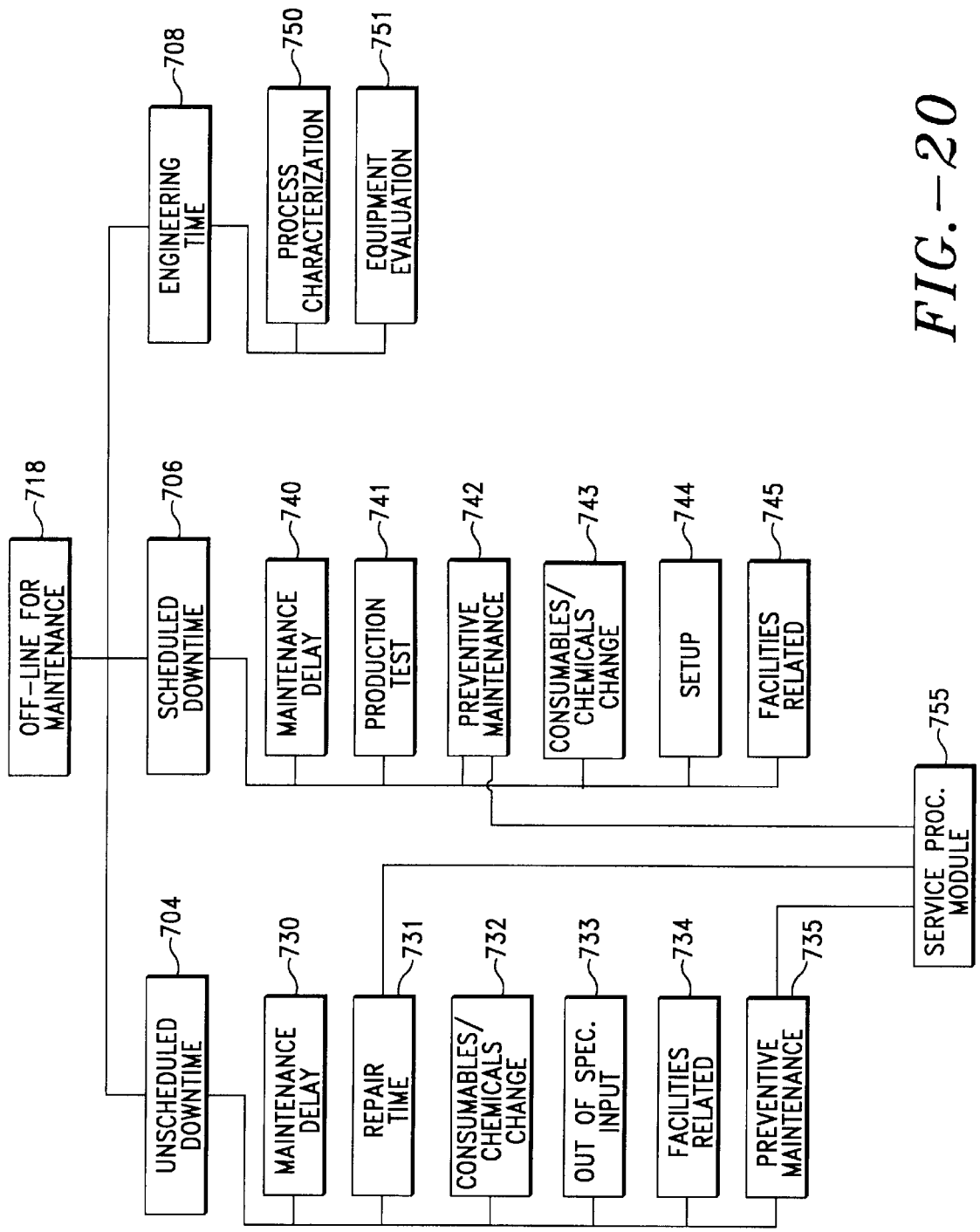
FIG. 20 is a block diagram schematically illustrating equipment time states of the stack chart illustrated in FIG. 19.

Returning to FIG. 19, total time period 714, is the total time during the period being measured, including the six equipment states 702–712. Non-scheduled time period 102 of total time 714 is not integrated in the computer environment. This time state includes recurring and non-recurring times, which are entered by the user. In this context an example of a recurring time state is a calendar of holidays which is entered ahead of time. Non-recurring non-scheduled time state includes for example power-off equipment time which is entered after it has occurred. Total integrated time 716 includes off-line for maintenance 718 and on line for process 720. As illustrated in FIG. 20, off-line for maintenance time state 718 of the present invention comprises unscheduled downtime 704, scheduled downtime 706 and engineering time 708. Unscheduled downtime 704 includes equipment states for maintenance delay time 730, repair time 731, consumables/chemicals change time 732, out of specification input time 733, facilities related time 734 and preventive maintenance time 735. Scheduled downtime 706 comprises equipment states for maintenance delay time 740, production test time 741, preventive maintenance time 742, consumables/chemicals change time 743, setup time 744 and facilities related time 745. Engineering time 708 includes equipment states for process characterization time 750 and equipment evaluation time 751.

Service procedures module 755 of the present invention, see FIG. 20, is optionally linked to repair time state 731 of unscheduled downtime 704, and to preventive maintenance state 742 of scheduled downtime 706. Additionally, preventive maintenance time state 735 of unscheduled downtime 704 can optionally be linked to service procedures module 755. Novel service procedures module 755 includes information and/or data structures for repair and/or maintenance procedures of the wafer fab tool, as well as tool calibration procedures. The procedures can be invoked when the linked time state, such as states 731, 735 or 742 is activated. Optionally, these procedures can also include information regarding spare parts specifications and/or availability. It is also contemplated to adapt service procedures module 755 for use with browser or search techniques to locate and/or link key words or phrases to appropriate sections in the service module. These key words or phrases will automatically link a searcher, such as an equipment operator detecting an equipment malfunction, to the appropriate section in the module to assist in diagnostic, repair and maintenance procedures and routines. Such browser or search techniques are well known to those of ordinary skill in the art.

Data structures or procedures of novel module 755 (see FIG. 20) can be stored on a removable electronic data storage medium, such as computer floppy disks, removable computer hard disks, magnetic tapes and optical disks, to facilitate the use of the same procedures at different manufacturing locations. Alternatively, the data structure can be stored on a non-removable electronic data storage medium, including a medium positioned at a location which is remote from the tool, using such storage devices as are well known to those of ordinary skill in the art. The data structures or procedures of module 755 can be communicated from a remote location to the tool using communication techniques which are well known to those of ordinary skill in the art including hard wire connections, wireless connections and data communication methods utilizing one or more modems or techniques using one or more computers commonly known as servers. Novel services module 755 can be operably connected to the tool using methods and device components which are well known to those of ordinary skill in the art.

Figure 21:
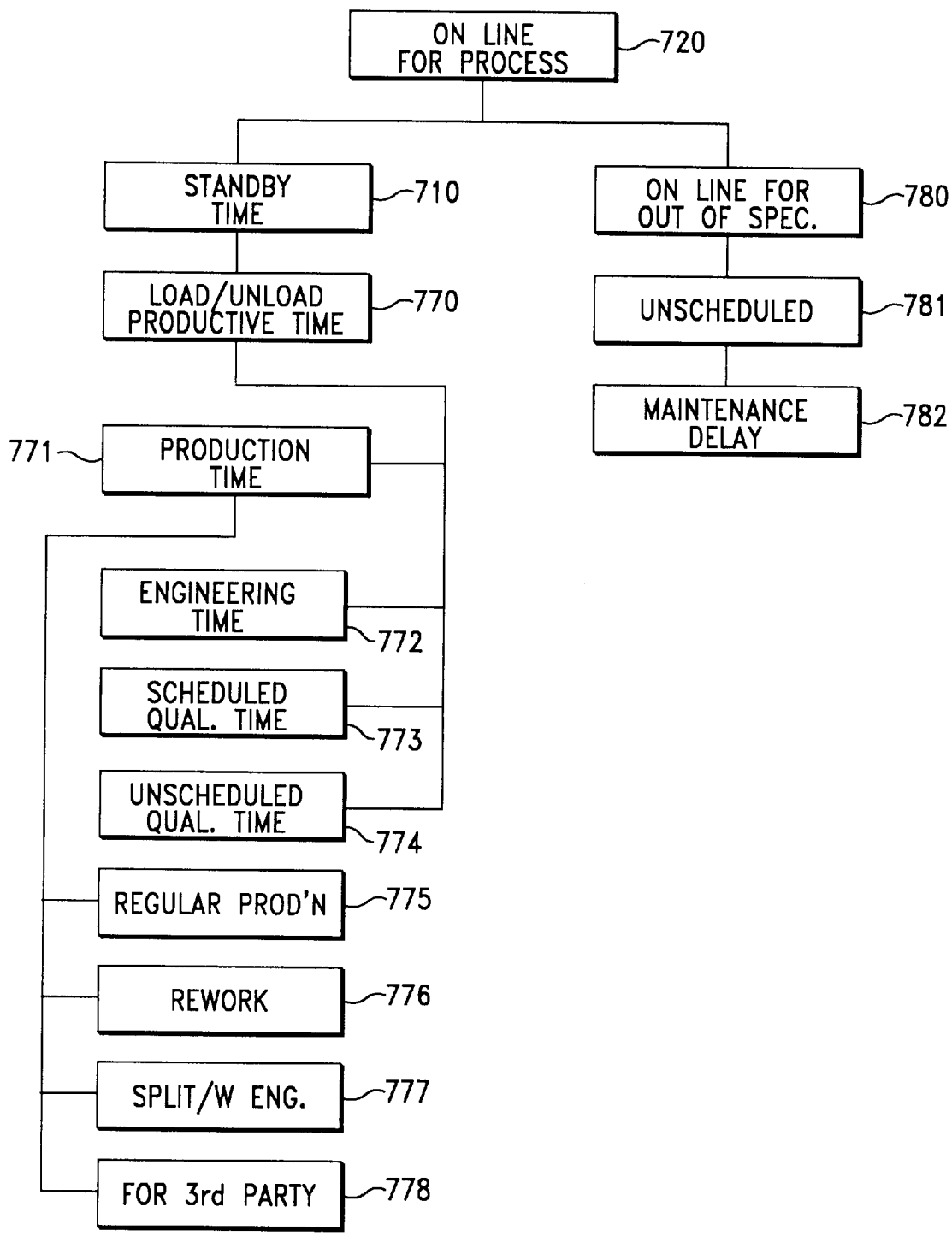
FIG. 21 is a block diagram schematically showing equipment time states of the stack chart illustrated in FIG. 19.

As shown in FIG. 21, on line for process time state 720 comprises standby time state 710, load/unload productive time state 770 and on line for out of specification time state 780. Load/unload productivity time state 770 includes equipment states for production time 771, engineering time 772, scheduled qualification time 773 and unscheduled qualification time 774, wherein qualification time refers to the time which is used to evaluate and qualify the tool, i.e. determine that the tool is operating satisfactory, after a tool change has been made. Production time state 771 comprises equipment states for regular production time 775, rework of product time 776, production time split with engineering time 777 and production for third party time 778. On line for out of specification time state 780 (FIG. 21) has an unscheduled time state 781 which has a maintenance delay time state 782.

A user, such as a wafer fab operator or technician, of novel process 700, illustrated in FIGS. 19–21, has the option to change or enable a state by interacting with the computer environment of the process through for example a keyboard command, a voice command or a pointing device such as a mouse or a light pen, using methods and technologies which are well known to those of ordinary skill in the art. The main equipment states are enabled as follows. Productive time state 712 (FIG. 19) is enabled when the user of the process or a host computer commands a load/unload state 770 (FIG. 21). Standby time state 710 (FIGS. 19 and 21) is enabled by the user. The standby state will be enabled automatically following a predetermined time interval, such as five minutes, if the user has not provided a standby input. Engineering time state 708 (FIGS. 18 and 19) provides optional user inputs to select process characterization 750 (FIG. 20) or equipment evaluation 751. Engineering time state 708 is allocated to engineering time state 772 (FIG. 21) as part of productive time state 712 (FIG. 19) if no user input is provided in time state 708.

Scheduled downtime state 706 (FIGS. 19 and 20) and associated states 740, 741, 742, 743, 744 and 745 (FIG. 20) are enabled by the user through interaction with the computer environment of the process, for example using a light pen command.

Unscheduled downtime state 704 (FIGS. 19 and 20) is enabled by a user during off-line for maintenance time state 718 when the product such as semiconductor wafers, or the fabricating process do not meet the required quality or performance criteria, using for example control charts to make this determination. Processing of the last wafer in the tool is completed and the host computer is alerted to the occurrence of a processing fault condition. Standby state 710 (FIGS. 19 and 21) is automatically enabled when the user does not provide an input or response to the unscheduled downtime state. The process remains in total integrated time state 716 (FIG. 19) unless the user provides an input corresponding to a non-scheduled time state 702.

On line for out of specification time state 780 (FIG. 21) is automatically activated when the product or process do not meet predetermined quality or performance criteria during the on line for process time state 720. State 780 automatically advances to unscheduled time state 781 which can enable an alarm condition, such as an audible or visible alarm, to alert the user to the occurrence of an out of specification event. State 781 automatically advances to maintenance delay state 782 which puts novel process 700 in a standby state. Maintenance delay state 782 requires user intervention for progressing to any other equipment time state of process novel 700. The automatic activation of time state 780 can be linked to process/quality control techniques. For example the novel SPC techniques using the SPDA techniques of the present invention can be adapted to provide an MES environment, such as MES environment 650 (FIG. 18), with an input indicating that the process is not within its control limits. This MES input can then cause novel process 700 to automatically invoke an online for out of specification time state 780 (FIG. 21), automatically resulting in maintenance delay state 782 which means that the process is aborted at this time state.

In another embodiment of the present invention, the novel equipment time states described in connection with FIGS. 19–21 are adapted to keep track of, and respond to, one or more maintenance trigger events. The expression "maintenance trigger event" as defined herein, includes events which automatically enable preventive maintenance time state 742 (FIG. 20) and service procedures module 755. Examples of maintenance trigger events include a predetermined total wafer count, predetermined total RF hours and predetermined total operating hours of a tool following the most recent tool maintenance. These trigger events are typically defined by a user of the tool. When the trigger event occurs, preventive maintenance time state 742 is automatically enabled thereby resulting in aborting the process run. It is also contemplated to integrate a trigger event alert in the present embodiment. The term "trigger event alert" as defined herein, includes an alert signal, such as an alarm, which is activated at a predetermined condition, point or time in the process prior to the occurrence of the maintenance trigger event. For example, a process having a predetermined maintenance trigger event after 500 operating hours can have a trigger event alert after 425 operating hours, i.e. 75 hours prior to the maintenance trigger event which will automatically abort the process run.

It is also contemplated to provide a novel product or a novel apparatus comprising one or more digitally coded data structures including the novel equipment time states of the present invention such as states 704, 706, 708, 710 and 712 (FIG. 19) of novel process 700 stored in a memory. These time state data structures are adapted for communicating with an apparatus such as a wafer fab tool using for example a communications standard such as SECS. Suitable memories for this novel product include removable electronic data storage devices, such as computer disks, magnetic tapes and optical disks. Suitable memories for a novel apparatus include data processing devices, such as computers, having a memory.

The computer integrated equipment time states of novel process 700 enable a user to determine the time state of any of the linked pieces of equipment in real time and it reduces the potential for ambiguity in equipment states such as can occur where these states are not integrated in a computer environment. Novel process 700 facilitates remote equipment time state determinations or reporting in real time when novel process 700 is linked to a network, such as an LAN, using such communication techniques as are well known to those of ordinary skill in the art.

The computer integrated equipment time states of the present invention are suitable for tracking, evaluating and communicating RAM equipment performance, such as RAM equipment performance. For example, operational uptime (%)=on line process time 720 (FIG. 21)×100%, divided by total integrated time 716 (FIG. 19), while operational utilization (%)=load/unload productive time 770 (FIG. 21)×100%, divided by total time 714 (FIG. 19).

It will be understood that the present invention which is exemplified by novel process 700 illustrated in FIGS. 19–21 is equally operable for processes or systems utilizing computer integrated equipment time states which differ from those described in connection with process 700.

The invention has been described in terms of the preferred embodiment. One skilled in the art will recognize that it would be possible to construct the elements of the present invention from a variety of means and to modify the placement of components in a variety of ways. While the embodiments of the invention have been described in detail and shown in the accompanying drawings, it will be evident that various further modifications are possible without departing from the scope of the invention as set forth in the following claims.

I claim:

1. A method of analyzing semiconductor processing data employing a computer, the method comprising:
   a) preparing a first graph of first semiconductor processing data comprising data of a first processing variable versus second semiconductor processing data comprising data of a second processing variable;
   b) preparing a second graph of third semiconductor processing data comprising data of the first processing variable versus fourth semiconductor processing data comprising data of the second processing variable;
   c) on the first graph, selecting a measure M1 of the second processing variable;
   d) on the second graph, determining the measure M1 of the second processing variable;
   e) overlaying M1 of the first graph on M1 of the second graph, wherein the first and second graphs are synchronized;
   f) on the first graph, selecting at least a second measure M2 of the second processing variable;
   g) on the second graph, determining the second measure M2;
   h) determining values of the first processing variable comprising (1) on the first graph (i) a first value V1, corresponding to measure M1 and (ii) a second value V2, corresponding to measure M2 and (2) on the second graph (i) a third value V3, corresponding to measure M1 and (ii) a fourth value V4, corresponding to measure M2;
   i) subtracting (1) V3 from V1, thereby obtaining a fifth value V5 and (2) V4 from V2, thereby obtaining a sixth value V6; and
   j) subtracting the second graph from the first graph by forming a graph through (1) a first data point comprising first data point coordinates M1 and V5 and (2) a second data point comprising second data point coordinates M2 and V6, thereby connecting the first coordinates to the second coordinates and forming a delta graph of the first and second graphs.

2. The method of claim 1 wherein the first and third data comprise data selected from the group consisting of semiconductor processing data, semiconductor processing parameters and semiconductor metrology data.

3. The method of claim 1 wherein the second processing variable comprises processing time.

4. The method of claim 1 wherein the first and third data comprise semiconductor processing control chart data.

5. The method of claim 1 wherein preparing a first graph comprises preparing a first graph of a first semiconductor processing tool which is operating a semiconductor process and wherein preparing a second graph comprises preparing a second graph of a second semiconductor processing tool which is operating the semiconductor process.

6. A computer implemented method of determining performance differences between semiconductor processing tools, the method comprising:
   a) executing a semiconductor processing technique in a first tool;
   b) acquiring first data of a semiconductor processing variable versus time of the processing technique executed in the first tool;
   c) preparing a first graph including the first data versus time, by using a graph coordinate axis having a time scale;
   d) executing the processing technique in a second tool;
   e) acquiring second data of the processing variable versus time of the processing technique executed in the second tool;
   f) preparing a second graph including second data versus time, by using the graph coordinate axis;
   g) overlaying the first graph on the second graph such that the first and second graphs are synchronized with respect to the time scale;
   h) on the time scale, selecting a first plurality of measures comprising time measures;
   i) on the first graph, determining a second plurality of measures comprising measures of the processing variable corresponding to the first plurality;
   j) on the second graph, determining a third plurality of measures comprising measures of the processing variable corresponding to the first plurality;
   k) subtracting the second plurality from the third plurality, thereby forming a fourth plurality comprising subtraction measures corresponding to the first plurality;
   l) determining a fifth plurality comprising graph coordinates including the fourth plurality and the first plurality, such that the fifth plurality corresponds to the first plurality; and
   m) employing the fifth plurality for forming a delta graph of the first and second graphs.

7. A method of controlling a computer implemented semiconductor fabrication process, the method comprising:
   a) executing the process;
   b) generating semiconductor fabrication process data;
   c) preparing a first graph of first data comprising data of a first semiconductor processing variable versus second data comprising data of a second semiconductor processing variable, by using a graph coordinate axis having scale for the second processing variable;
   d) preparing a second graph of third data comprising data of the first processing variable versus fourth data comprising data of the second processing variable, by using the graph coordinate axis;
   e) overlaying the first graph on the second graph such that the first and second graphs are synchronized with respect to the graph coordinate axis;

f) on the graph coordinate axis, selecting a first plurality of measures comprising measures of the second processing variable;

g) on the first graph, determining a second plurality of measures comprising measures of the first processing variable corresponding to the first plurality;

h) on the second graph, determining a third plurality of measures comprising measures of the first processing variable corresponding to the first plurality;

i) subtracting the second plurality from the third plurality, thereby forming a fourth plurality comprising subtraction measures corresponding to the first plurality;

j) determining a fifth plurality comprising graph coordinates including the fourth plurality and the first plurality, such that the fifth plurality corresponds to the first plurality;

k) employing the fifth plurality for forming a delta graph of the first and second graphs;

l) analyzing the delta graph, thereby obtaining analysis results;

m) comparing the analysis results with predetermined process criteria; and n) adjusting the process if the results do not meet the criteria.

8. An apparatus comprising an environment adapted for: (1) acquiring first data comprising data of a first semiconductor processing variable versus second data comprising data of a second semiconductor processing variable, (2) acquiring third data of the first processing variable versus fourth data comprising data of the second processing variable, (3) plotting the first data versus the second data, by using a graph coordinate axis having a scale for the second processing variable, thereby forming a first graph, (4) plotting the third data versus the fourth data by using the graph coordinate axis, thereby forming a second graph and (5) overlaying the first graph on the second graph such that the first and second graphs are synchronized with respect to the graph coordinate axis, (6) on the graph coordinate axis, selecting a first plurality of measures comprising measures of the second processing variable, (7) on the first graph, determining a second plurality of measures comprising measures of the first processing variable corresponding to the first plurality, (8) on the second graph, determining a third plurality of measures comprising measures of the first processing variable corresponding to the first plurality, (9) subtracting the second plurality from the third plurality, thereby forming a fourth plurality comprising subtraction measures corresponding to the first plurality, (10) determining a fifth plurality comprising graph coordinates including the fourth plurality and the first plurality, such that the fifth plurality corresponds to the first plurality and (11) employing the fifth plurality for constructing a delta graph of the first and second graphs.

9. An apparatus for controlling a semiconductor fabrication process, the apparatus comprising:

a) a first environment adapted for: (1) acquiring first data comprising data of a first semiconductor processing variable versus second data comprising data of a second semiconductor processing variable, (2) acquiring third data comprising data of the first processing variable versus fourth data comprising data of the second processing variable, (3) plotting the first data versus the second data, by using a graph coordinate axis having a scale for the second processing variable, thereby forming a first graph, (4) plotting the third data versus the fourth data by using the graph coordinate axis, thereby forming a second graph and (5) overlaying the first graph on the second graph such that the first and second graphs are synchronized with respect to the graph coordinate axis, (6) on the graph coordinate axis, selecting a first plurality of measures comprising measures of the second processing variable, (7) on the first graph, determining a second plurality of measures comprising measures of the first processing variable corresponding to the first plurality, (8) on the second graph, determining a third plurality of measures comprising measures of the first processing variable corresponding to the first plurality, (9) subtracting the second plurality from the third plurality, thereby forming a fourth plurality comprising subtraction measures corresponding to the first plurality, (10) determining a fifth plurality comprising graph coordinates including the fourth plurality and the first plurality, such that the fifth plurality corresponds to the first plurality and (11) employing the fifth plurality for constructing a delta graph of the first and second graphs;

b) a second environment adapted for analyzing the delta graph, thereby obtaining an analysis result; and c) a third environment adapted for communicating the result to the process.

10. The apparatus of claim 9 additionally comprising a fourth environment adapted for: (1) comparing the analysis result with predetermined process criteria, and (2) intervening in the process if the analysis result does not meet the process criteria.

11. The apparatus of claim 10 wherein intervening comprises automatically intervening.

12. A memory including a digitally encoded data structure adapted for forming a delta graph from a first graph and a second graph, the structure comprising:

a) a first digital transducer output of an IC processing chamber including the first graph comprising a first processing variable versus a second processing variable;

b) a second digital transducer output of an IC processing chamber including the second graph comprising the first processing variable versus the second processing variable;

c) a first algorithm for overlaying the first graph on the second graph, such that the first and second graphs are synchronized; and d) a second algorithm for forming the delta graph from the synchronized first and second graphs, by subtracting the first digital transducer output comprising the first graph from the second digital transducer output comprising the second graph.

13. A method for enabling an equipment time state of an apparatus for executing a process wherein the process is integrated with the equipment time state, the method comprising:

a) defining equipment time states having a plurality of computer integrated time states including one or more time states which are integrated with the process;

b) determining a process control limit comprising a delta graph technique control limit; and c) activating the one or more process integrated time states if the process is executed outside of the control limit.

14. An apparatus which is adapted for executing a process, the apparatus comprising:

a) computer integrated equipment time states;

b) a process control limit which is determined through a delta graph technique; and c) a link between the delta graph technique and at least one of the time states wherein the link is activated if the process is executed outside the control limit.

15. The method of claim 7, wherein the predetermined process criteria comprise the delta graph forming a substantially straight line approximately parallel to data axis of the second data of the delta graph.

16. The apparatus of claim 10, wherein the predetermined process criteria comprise the delta graph forming a substantially straight line approximately parallel to a data axis of the second data of the delta graph.

17. The method of claim 1 wherein the first processing variable is selected from the group consisting of chamber bias forward power, chamber pressure and chamber RF peak-to-peak voltage.

18. The method of claim 6 wherein the first processing variable is selected from the group consisting of chamber bias forward power, chamber pressure and chamber RF peak-to-peak voltage.

19. The apparatus of claim 8 wherein the first processing variable is selected from the group consisting of chamber bias forward power, chamber pressure and chamber RF peak-to-peak voltage.

20. The apparatus of claim 8 wherein the first and third data comprise data selected from the group consisting of semiconductor processing data, semiconductor processing parameters and semiconductor metrology data.

21. A method of analyzing semiconductor processing data employing a computer, the method comprising:

a) preparing a first graph of first semiconductor processing data comprising data of a first processing variable versus second semiconductor processing data comprising data of a second processing variable, wherein the first variable is selected from the group consisting of chamber bias forward power, chamber pressure and chamber RF peak-to-peak voltage;

b) preparing a second graph of third semiconductor processing data comprising data of the first processing variable versus fourth semiconductor processing data comprising data of the second processing variable;

c) overlaying the first graph on the second graph, such that the first and second graphs are synchronized; and d) forming a delta graph of the first and second graphs.

22. A method of analyzing data employing a computer, the method comprising:

a) preparing a first graph of first data comprising data of a first variable versus second data comprising data of a second variable;

b) preparing a second graph of third data comprising data of the first variable versus fourth data comprising data of the second variable;

c) overlaying the first graph on the second graph such that the first and second graphs are synchronized;

d) forming a delta graph of the first and second graphs; and e) analyzing the delta graph to determine whether the delta graph forms a substantially straight line approximately parallel to a data axis of the second variable.

* * * * *